United States Patent
Funaki et al.

(10) Patent No.: US 8,760,943 B2
(45) Date of Patent: Jun. 24, 2014

(54) SEMICONDUCTOR APPARATUS

(75) Inventors: Toshihiko Funaki, Kanagawa (JP); Toshiharu Okamoto, Kanagawa (JP); Muneaki Matsushige, Kanagawa (JP); Kenichi Kuboyama, Kanagawa (JP); Shuuichi Senou, Kanagawa (JP); Susumu Takano, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/599,730

(22) Filed: Aug. 30, 2012

(65) Prior Publication Data

US 2013/0051110 A1   Feb. 28, 2013

(30) Foreign Application Priority Data

Aug. 31, 2011   (JP) .................... 2011-188636

(51) Int. Cl.
| | |
|---|---|
| G11C 7/00 | (2006.01) |
| G11C 7/10 | (2006.01) |
| G11C 8/00 | (2006.01) |
| G11C 8/06 | (2006.01) |
| G11C 8/12 | (2006.01) |
| G11C 11/4096 | (2006.01) |

(52) U.S. Cl.
CPC .......... *G11C 7/1048* (2013.01); *G11C 11/4096* (2013.01); *G11C 7/10* (2013.01); *G11C 7/1006* (2013.01); *G11C 7/00* (2013.01); *G11C 8/12* (2013.01)
USPC ............ 365/189.17; 365/189.02; 365/189.05; 365/230.02; 365/230.03; 365/203.06

(58) Field of Classification Search
CPC .... G11C 7/1048; G11C 11/4096; G11C 7/10; G11C 8/12; G11C 7/1006; G11C 7/00; G11C 8/00; G11C 8/06
USPC ............. 365/189.17, 230.03, 230.04, 230.05, 365/230.06, 189.02, 230.02
See application file for complete search history.

(56) References Cited

U.S. PATENT DOCUMENTS

| | | | | |
|---|---|---|---|---|
| 7,539,076 | B1 * | 5/2009 | Vernenker et al. | 365/230.05 |
| 8,200,901 | B1 * | 6/2012 | Wentzlaff et al. | 711/119 |
| 8,467,218 | B1 * | 6/2013 | Atsatt et al. | 365/63 |
| 2008/0175070 | A1 * | 7/2008 | Perego et al. | 365/189.04 |
| 2009/0240866 | A1 | 9/2009 | Kajigaya | |
| 2012/0239898 | A1 * | 9/2012 | Ware | 711/167 |
| 2013/0007350 | A1 * | 1/2013 | D'Abreu et al. | 711/103 |

FOREIGN PATENT DOCUMENTS

| | | |
|---|---|---|
| JP | 9-231131 A | 9/1997 |
| JP | 2009-230776 A | 10/2009 |

\* cited by examiner

*Primary Examiner* — Ly D Pham
(74) *Attorney, Agent, or Firm* — Sughrue Mion, PLLC

(57) ABSTRACT

A semiconductor apparatus according to an aspect of the present invention includes first and second bus-interface circuits, a first memory core connected to the first bus-interface circuit through a first data bus, the first memory core being connected to a first access control signal output from the first bus-interface circuit, a second memory core connected to the second bus-interface circuit through a second data bus, and a select circuit that selectively connects one of the first access control signal and a second access control signal output from the second bus-interface circuit to the second memory core.

17 Claims, 20 Drawing Sheets

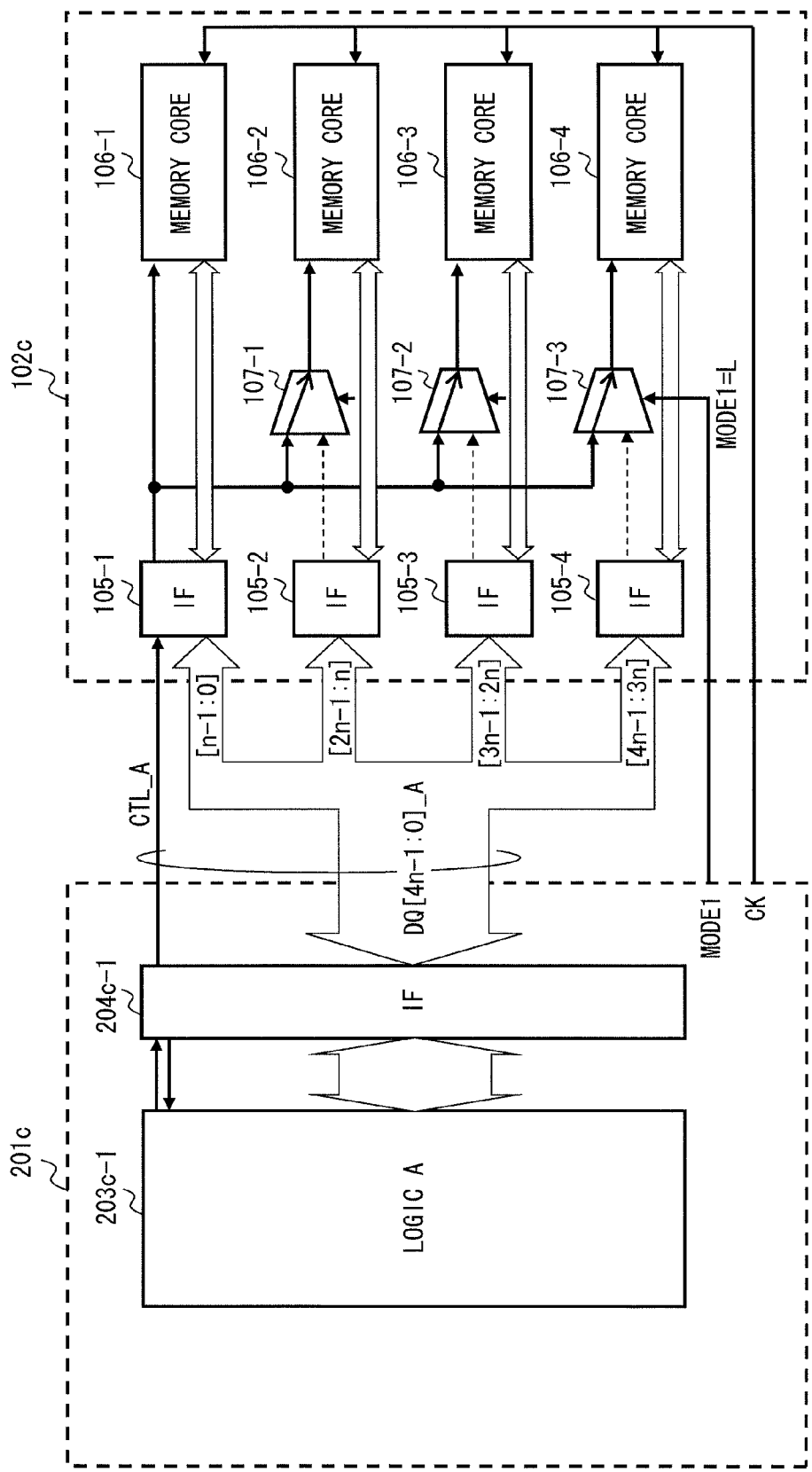

| FIRST MEMORY CORE SIGNAL | | INTERFACE SIGNAL | |
|---|---|---|---|
| | | MODE2=H | MODE2=L |
| CMD, ADD | CSN_c1 | CSN_A | CSN_A |
| | WEN_c1 | WEN_A | WEN_A |
| | REFN_c1 | REFN_A | REFN_A |
| | A[0]_c1~A[m-2]_c1 | A[0]_A~A[m-2]_A | A[0]_A~A[m-2]_A |
| | — | A[m-1]_A (DATA SELECT) | A[m-1]_A (DATA SELECT) |
| DATA | D[0]_c1~D[n-1]_c1 | DQ[0]_A~DQ[n-1]_A (WHEN A[m-1]_A=L) | DQ[0]_A~DQ[n-1]_A (WHEN A[m-1]_A=L) |
| | D[n]_c1~D[2n-1]_c1 | DQ[0]_A~DQ[n-1]_A (WHEN A[m-1]_A=H) | DQ[n]_A~DQ[2n-1]_A (WHEN A[m-1]_A=L) |
| | Q[0]_c1~Q[n-1]_c1 | DQ[0]_A~DQ[n-1]_A (WHEN A[m-1]_A=L) | DQ[0]_A~DQ[n-1]_A (WHEN A[m-1]_A=L) |
| | Q[n]_c1~Q[2n-1]_c1 | DQ[0]_A~DQ[n-1]_A (WHEN A[m-1]_A=H) | DQ[n]_A~DQ[2n-1]_A (WHEN A[m-1]_A=L) |

Fig. 7A

| SECOND MEMORY CORE SIGNAL | | INTERFACE SIGNAL | |
| --- | --- | --- | --- |
| | | MODE2=H | MODE2=L |
| CMD, ADD | CSN_c2 | CSN_B | CSN_A |
| | WEN_c2 | WEN_B | WEN_A |
| | REFN_c2 | REFN_B | REFN_A |
| | A[0]_c2~A[m-2]_c2 | A[0]_B~A[m-2]_B | A[0]_A~A[m-2]_A |
| | — | A[m-1]_B (DATA SELECT) | A[m-1]_A (DATA SELECT) |
| DATA | D[0]_c2~D[n-1]_c2 | DQ[0]_B~DQ[n-1]_B (WHEN A[m-1]_B=L) | DQ[0]_A~DQ[n-1]_A (WHEN A[m-1]_A=H) |
| | D[n]_c2~D[2n-1]_c2 | DQ[0]_B~DQ[n-1]_B (WHEN A[m-1]_B=H) | DQ[n]_A~DQ[2n-1]_A (WHEN A[m-1]_A=H) |
| | Q[0]_c2~Q[n-1]_c2 | DQ[0]_B~DQ[n-1]_B (WHEN A[m-1]_B=L) | DQ[0]_A~DQ[n-1]_A (WHEN A[m-1]_A=H) |
| | Q[n]_c2~Q[2n-1]_c2 | DQ[0]_B~DQ[n-1]_B (WHEN A[m-1]_B=H) | DQ[n]_A~DQ[2n-1]_A (WHEN A[m-1]_A=H) |

SEMICONDUCTOR APPARATUS

CROSS-REFERENCE TO RELATED APPLICATIONS

This application is based upon and claims the benefit of priority from Japanese patent application No. 2011-188636, filed on Aug. 31, 2011, the disclosure of which is incorporated herein in its entirety by reference.

BACKGROUND

The present invention relates to a semiconductor apparatus, in particular, a semiconductor apparatus suitable for preventing the deterioration of the data processing performance.

As the semiconductor manufacturing process has been miniaturized, the scale of a circuit that can be mounted on one semiconductor chip is increasing. As a result, in logic LSIs, a large number of functional blocks necessary for the system can be mounted on one semiconductor chip. Therefore, a larger number of data processes are carried out in a logic LSI. Because of this trend, it has been required to improve data transfer performance between a logic LSI and a memory and thereby improve the overall data processing performance of the system.

Further, it has become more common to incorporate a functional block that processes data having a data width larger than the maximum data width with which the memory can simultaneously read/write data, into a logic LSI. Even in such situations, it has been desired to improve the data transfer performance between the logic LSI and the memory and thereby improve the overall data processing performance of the system.

Japanese Unexamined Patent Application Publications No. 9-231131 and No. 2009-230776 disclose related art.

A memory having a variable data width disclosed in Japanese Unexamined Patent Application Publication No. 9-231131 is constructed by combining four memories, and thereby can change its processible data width to 8, 16, or 32 bits.

A multi-port memory disclosed in Japanese Unexamined Patent Application Publication No. 2009-230776 is equipped with a path switching circuit capable of arbitrarily configuring signal paths of a command, an address, and input/output data between a plurality of input/output ports and a plurality of memory banks, and thereby can allocate a plurality of arbitrarily-selected input/output ports to a selected memory bank.

SUMMARY

The present inventors have found the following problem. The memory having a variable data width disclosed in Japanese Unexamined Patent Application Publication No. 9-231131 can perform data transfer of an arbitrary data width with one CPU (functional block). However, since the number of routes for the address signal that can be input is only one, it is impossible to simultaneously perform a plurality of data transfer operations with a plurality of CPUs (functional blocks). If a plurality of data transfer operations need to be performed with a plurality of CPUs, it is necessary to perform the data transfer operations one after another by using an arbitration circuit or the like. Therefore, this memory having a variable data width has a problem that the data processing performance deteriorates.

As described above, in the related art, there is a problem that when a plurality of data transfer operations are performed with a plurality of functional blocks, the data processing performance deteriorates.

A first aspect of the present invention is a semiconductor apparatus including: a plurality of bus-interface circuits; memory cores each of which is provided for a respective one of the bus-interface circuits; and a select circuit that selects an access control signal to be input to the memory cores.

With the above-described circuit configuration, it is possible to prevent the deterioration of the data processing performance.

According to the present invention, it is possible to provide a semiconductor apparatus capable of preventing the deterioration of the data processing performance.

BRIEF DESCRIPTION OF THE DRAWINGS

The above and other aspects, advantages and features will be more apparent from the following description of certain embodiments taken in conjunction with the accompanying drawings, in which:

FIG. 2C is a block diagram showing a semiconductor integrated circuit according to a third embodiment of the present invention;

FIG. 7A is a table for explaining signal paths of a memory according to a fourth embodiment of the present invention;

FIG. 7B is a table for explaining signal paths of a memory according to a fourth embodiment of the present invention;

DETAILED DESCRIPTION

Firstly, before explaining embodiments according to the present invention, a configuration that has been examined by the inventors of the present application prior to accomplishing the present invention is explained hereinafter. The inventors of the present application had examined a configuration shown in FIG. 12 in order to improve the data transfer performance between a logic LSI on which a functional block that transmits/receives a data signal having a large data width is mounted and a memory.

Figure 12:
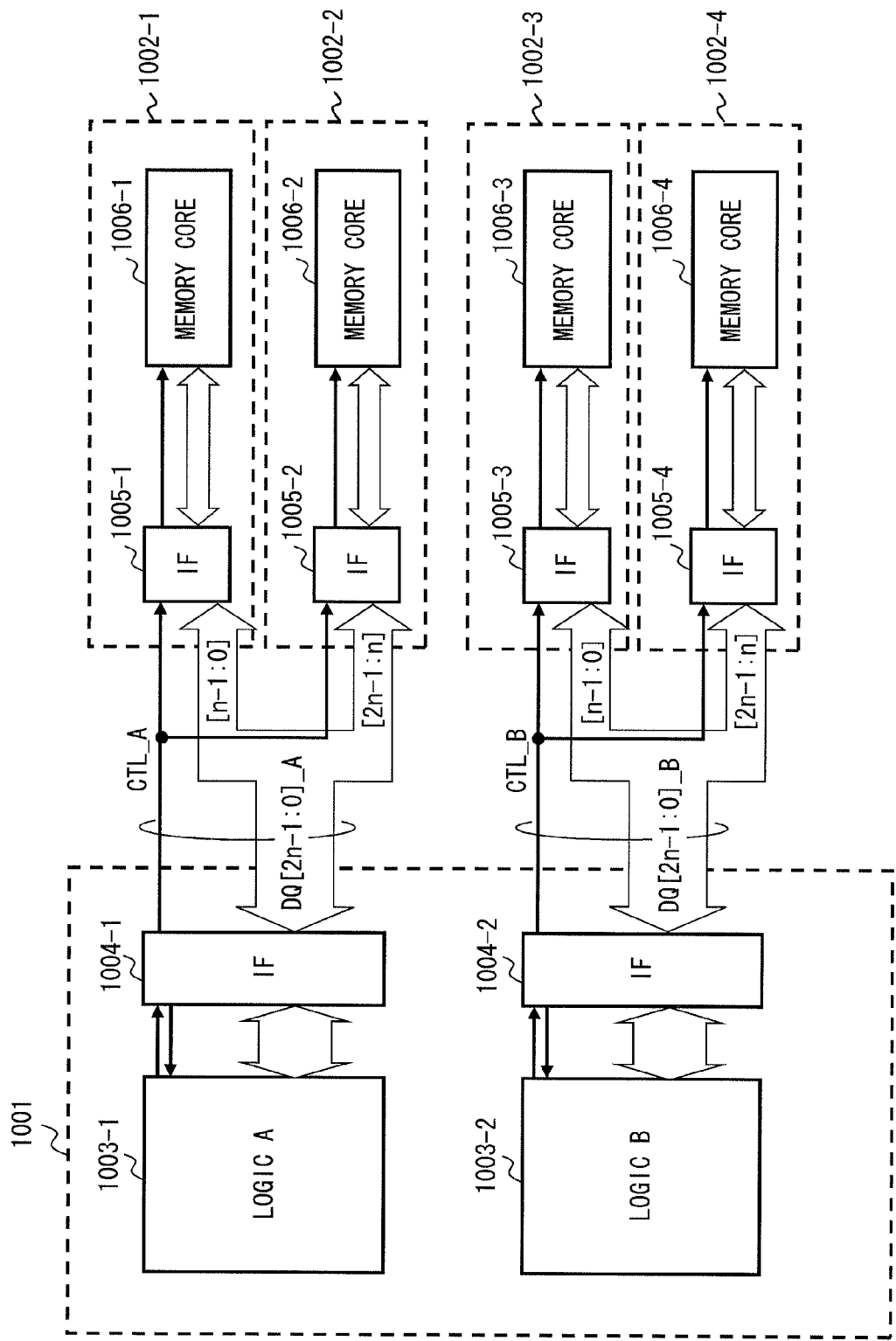
FIG. 12 is a block diagram showing a semiconductor integrated circuit according to an idea conceived before the present invention is accomplished.

FIG. 12 is a block diagram showing a semiconductor integrated circuit according to an idea conceived before the present invention is accomplished. A semiconductor integrated circuit shown in FIG. 12 includes a plurality of memories for a functional block that transmits/receives a data signal having a large data width, and exchanges a data signal between the functional block and the plurality of memories. The semiconductor integrated circuit is explained hereinafter in a more detailed manner.

The semiconductor integrated circuit shown in FIG. 12 includes an integrated circuit 1001 including a plurality of functional blocks, and memories 1002-1 to 1002-4. Each functional block accesses the memories 1002-1 to 1002-4 by using a set of signals (channel) consisting of a data signal (data), a command signal used to control the reading/writing of the data, and an address signal specifying a storage area from/to which the data is read/written. In the following explanation, the term "access" means an exchange of a data signal, an address signal, and a command signal performed between an external circuit such as a functional block and a memory. Further, in the following explanation, an address signal and a command signal may be collectively called "access control signal".

The memories 1002-1 to 1002-4 include respective memory cores 1006-1 to 1006-4 and respective interface circuits 1005-1 to 1005-4.

Each of the memory cores 1006-1 to 1006-4 includes a plurality of memory cells (storage areas) for storing data. In each of the memory cores 1006-1 to 1006-4, data is written into a memory cell(s) specified by an address signal, or data stored in a memory cell(s) specified by an address signal is read out. The switching between a data reading operation and a data writing operation is performed according to a write enable signal included in the command signal.

It is assumed that each of the memory cores 1006-1 to 1006-4 can simultaneously read or write data having a data width of n bits (n is a natural number) at the maximum.

Each of the interface circuits 1005-1 to 1005-4 interfaces access from the integrated circuit 1001 to the memory cores 1006-1 to 1006-4. Each of the interface circuits 1005-1 to 1005-4 can interface a data signal having an n-bit width.

The integrated circuit 1001 is, for example, an FPGA (Field Programmable Gate Array) whose configuration can be changed by software. In the field of embedded devices such as digital appliances and network devices, it is possible to provide a plurality of derived products by using common FPGA substrates (platforms). In the following explanation, an example in which the integrated circuit 1001 is an FPGA (hereinafter called "FPGA 1001") is explained.

By programming the FPGA 1001, the FPGA 1001 includes two independent functional blocks 1003-1 and 1003-2 and interface circuits 1004-1 and 1004-2.

It is assumed that each of the functional blocks 1003-1 and 1003-2 transmits/receives data having a data width larger than the maximum data width with which the memory core can simultaneously read/write data. Specifically, each of the functional blocks 1003-1 and 1003-2 transmits/receives data having a data width of 2n bits.

The interface circuit 1004-1 interfaces access from the functional block 1003-1 to two memories 1002-1 and 1002-2. The interface circuit 1004-2 interfaces access from the functional block 1003-2 to two memories 1002-3 and 1002-4. Each of the interface circuits 1004-1 and 1004-2 can interface a data signal having a 2n-bit width.

The functional block 1003-1 accesses the memories 1002-1 and 1002-2 for the purpose of temporarily saving work data or the like.

For example, when data is to be written into the memory, the functional block 1003-1 transmits data DQ[2n−1:0]_A having a 2n-bit width (the number inside the brackets [ ] is a bit number; this is also true for other data signal names and address signal names shown below; and the brackets [ ] maybe omitted and it maybe simply expressed as "data DQ_A" or the like) and a corresponding access control signal CTL_A to the memories 1002-1 and 1002-2 through the interface circuit 1004-1. Data DQ[n−1:0]_A corresponding to an n-bit width is supplied to the interface circuit 1005-1 in the memory 1002-1, and the remaining data DQ[2n−1:n]_A corresponding to another n-bit width is supplied to the interface circuit 1005-2 in the memory 1002-2. Then, the data DQ[n−1:0]_A supplied to the interface circuit 1005-1 is input to the memory core 1006-1 and the data DQ[2n−1:n]_A supplied to the interface circuit 1005-2 is input to the memory core 1006-2. In this process, the access control signal CTL_A transmitted from the functional block 1003-1 is supplied to both of the memories 1002-1 and 1002-2. As a result, the data DQ[n−1:0]_A having an n-bit width is written into the memory core 1006-1 and the remaining data DQ[2n−1:n]_A having an n-bit width is written into the memory core 1006-2.

Further, when data is to be read from the memory, the functional block 1003-1 transmits the access control signal CTL_A to the memories 1002-1 and 1002-2 through the interface circuit 1004-1. This access control signal CTL_A is supplied to both of the memories 1002-1 and 1002-2. As a result, the data DQ[n−1:0]_A having an n-bit width is read from the memory core 1006-1 and the remaining data DQ[2n−1:n]_A having an n-bit width is read from the memory core 1006-2. The functional block 1003-1 receives the data DQ[n−1:0]_A having an n-bit width and the data DQ[2n−1:n]_A having an n-bit width, which are read from the memories 1002-1 and 1002-2 respectively, as data DQ[2n−1:0]_A having a 2n-bit width.

Similarly, the functional block 1003-2 accesses the memories 1002-3 and 1002-4 for the purpose of temporarily saving work data or the like.

For example, when data is to be written into the memory, the functional block 1003-2 transmits data DQ[2n−1:0]_B having a 2n-bit width and a corresponding access control signal CTL_B to the memories 1002-3 and 1002-4 through the interface circuit 1004-2. Data DQ[n−1:0]_B corresponding to an n-bit width is supplied to the interface circuit 1005-3 in the memory 1002-3, and the remaining data DQ[2n−1:n]_B corresponding to another n-bit width is supplied to the interface circuit 1005-4 in the memory 1002-4. Then, the data DQ[n−1:0]_B supplied to the interface circuit 1005-3 is input to the memory core 1006-3 and the data DQ[2n−1:n]_B supplied to the interface circuit 1005-4 is input to the memory core 1006-4. In this process, the access control signal CTL_B transmitted from the functional block 1003-2 is supplied to both of the memories 1002-3 and 1002-4. As a result, the data DQ[n−1:0]_B having an n-bit width is written into the memory core 1006-3 and the remaining data DQ[2n−1:n]_B having an n-bit width is written into the memory core 1006-4.

Further, when data is to be read from a memory, the functional block 1003-2 transmits the access control signal CTL_B to the memories 1002-3 and 1002-4 through the interface circuit 1004-2. This access control signal CTL_B is supplied to both of the memories 1002-3 and 1002-4. As a result, the data DQ[n−1:0]_B having an n-bit width is read from the memory core 1006-3 and the remaining data DQ[2n−1:n]_B having an n-bit width is read from the memory core 1006-4. The functional block 1003-2 receives the data DQ[n−1:0]_B having an n-bit width and the data DQ[2n−1:n]_B having an n-bit width, which are read from the memories 1002-3 and 1002-4 respectively, as data DQ[2n−1:0]_B having a 2n-bit width.

As described above, the semiconductor integrated circuit shown in FIG. 12 includes a plurality of memories for a functional block that transmits/receives a data signal having a large data width, and exchanges a data signal between the functional block and the plurality of memories.

However, since the semiconductor integrated circuit shown in FIG. 12 needs to include a plurality of memories for each functional block, the overall number of components in the semiconductor integrated circuit becomes larger. Specifically, the number of components in the semiconductor integrated circuit shown in FIG. 12 is five, i.e., one FPGA 1001 and four memories 1002-1 to 10002-4. As a result, the number of signal lines connected among these chips also becomes larger, and thereby making the circuit board congested with the wiring lines. In particular, the accesses control signals (address signals and command signals) transmitted from respective functional blocks need to be supplied to every one of the plurality of memories. As a result, the length of the signals lines that are used to transmit the access control signals increases, and thereby making the circuit board congested with the wiring lines. Consequently, there was a problem that it was very difficult to adjust timings control the characteristics such as crosstalk, and so on.

Meanwhile, as described above, the configuration of the FPGA 1001 can be changed by software. Therefore, in the semiconductor integrated circuit shown in FIG. 12, it is possible to change the system specifications by changing the configuration of the FPGA 1001 even after the system board is constructed. However, there is a problem that since the wiring lines on the circuit board cannot be changed, it is impossible to change a functional block(s) provided in the FPGA 1001 to a different functional block(s) that transmits/receives data having a larger data width. When a functional block(s) needs to be changed to a different functional block(s) that transmits/receives data having a larger data width, it is necessary to construct a different system board, and thus causing a problem that the number of design processes increases.

Embodiments according to the present invention are explained hereinafter with reference to the drawings. It should be noted that the drawings are made in a simplified manner, and therefore the technical scope of the present invention should not be narrowly interpreted based on these drawings. Further, the same components are assigned with the same symbols and their duplicated explanation is omitted.

First Embodiment

Figure 1:
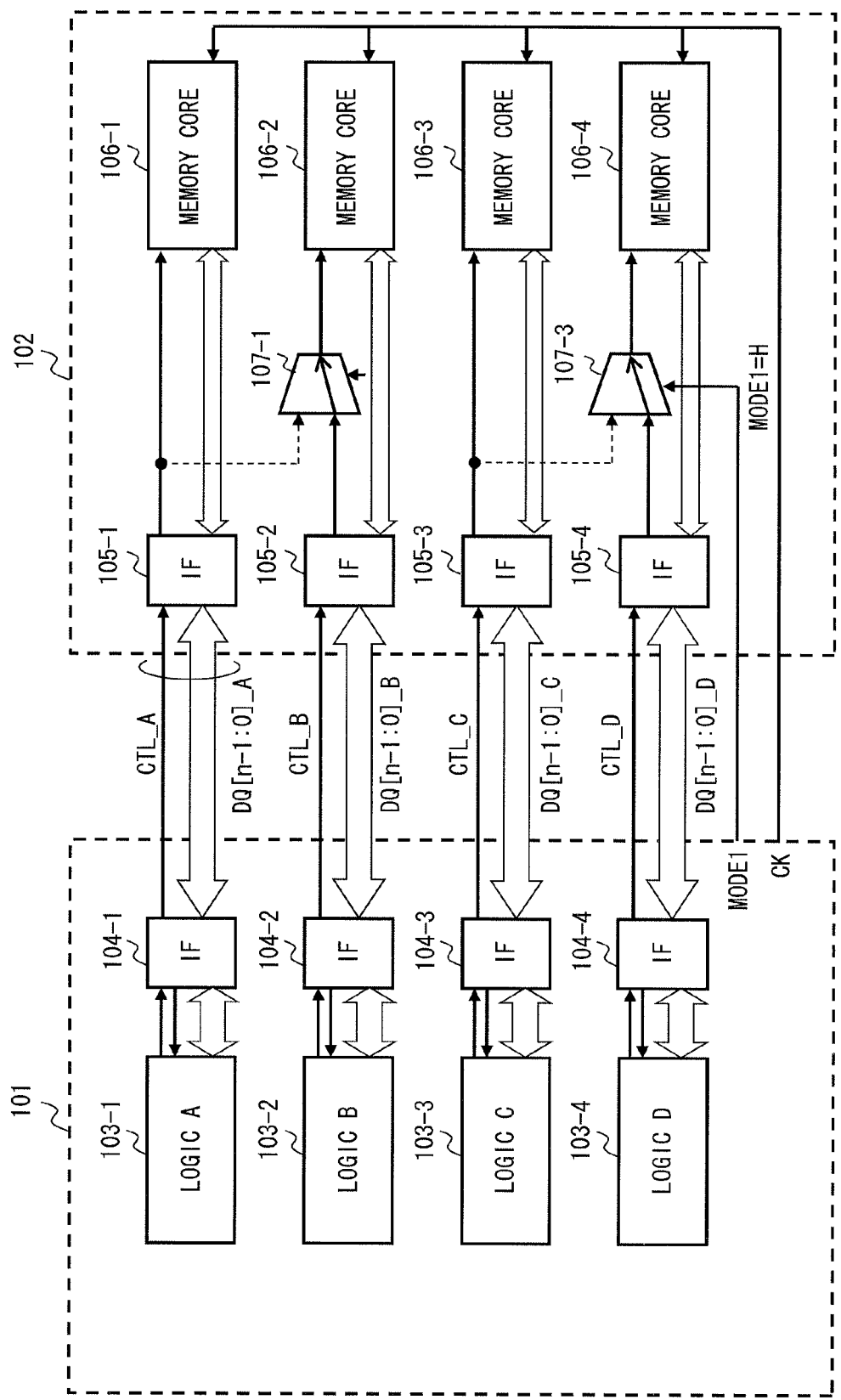
FIG. 1 is a block diagram showing a semiconductor integrated circuit according to a first embodiment of the present invention.

FIG. 1 is a block diagram showing a semiconductor integrated circuit including a memory (semiconductor device) according to a first embodiment of the present invention. In the memory according to this embodiment, data signal paths are set between a plurality of interface circuits and a plurality of memory cores in such a manner that each of the plurality of interface circuits can interface a data signal for a different one of the plurality of memory cores. In this way, in the memory according to this embodiment, each memory core is never accessed from two or more functional blocks simultaneously. Therefore, there is no need to perform arbitration by using an arbitration circuit, and thus making it possible to prevent the deterioration of the data processing performance.

Further, the memory according to this embodiment includes a select circuit (path switching circuit) that sets the path of an access control signal (address signal and command signal) between an interface circuit to which the access control signal is supplied and at least one of the memory cores that is selected according to a switching signal MODE1. Therefore, the memory according to this embodiment has such a configuration that irrespective of the data width of a data signal supplied from the external circuit, an access control signal corresponding to that data signal is received from one of the interface circuits. As a result, in the semiconductor integrated circuit according to this embodiment, the length of signal line(s) that is used to transmit the access control signal(s) decreases in comparison to the related art, and thus making the circuit board less congested with the wiring lines. Consequently, it is possible to facilitate the adjustment of timings, the control of the characteristics such as crosstalk, and so on in comparison to the related art. In other words, the semiconductor integrated circuit according to this embodiment can prevent designing a semiconductor integrated circuit under the design requirements from becoming very difficult. The semiconductor integrated circuit is explained hereinafter in a more detailed manner.

A semiconductor integrated circuit shown in FIG. 1 includes an integrated circuit (external circuit) 101 including a plurality of functional blocks, and a memory 102. Note that the integrated circuit 101 is, for example, an FPGA (Field Programmable Gate Array) whose configuration can be changed by software. In the following explanation, an example in which the integrated circuit 101 is an FPGA (hereinafter called "PFGA 101") is explained.

The memory 102 includes four independently-accessible memory cores 106-1 to 106-4, interface circuits 105-1 to 105-4, and select circuits (path switching circuits) 107-1 and 107-3. The signal transmission between the FPGA 101 and the memory 102 is performed through an external bus(es). Note that the memory cores 106-1 and 106-2 may be also called "first memory core" and "second memory core" respectively. Further, the interface circuits 105-1 and 105-2 may be also called "first bus-interface circuit" and "second bus-interface circuit" respectively.

Each of the memory cores 106-1 to 106-4 includes a plurality of memory cells (storage areas) for storing data. In each of the memory cores 106-1 to 106-4, data is written into a memory cell(s) specified by an address signal, or data stored in a memory cell(s) specified by an address signal is read out. The switching between a data reading operation and a data writing operation is performed according to a write enable signal included in the command signal.

Note that in this embodiment, an example in which each of the memory cores 106-1 to 106-4 can simultaneously read or write data having a data width of n bits (n is a natural number) at the maximum is explained.

The interface circuits 105-1 to 105-4 interface the exchanges of data signals performed between the FPGA 101 and the memory cores 106-1 to 106-4 respectively. That is, paths of data signals are set between the interface circuits 105-1 to 105-4 and the memory cores 106-1 to 106-4 in a one-to-one relation. Note that the data signal path connecting the interface circuit (first bus-interface circuit) 105-1 with the memory core (first memory core) 106-1 may be also called "first data bus". Further, the data signal path connecting the interface circuit (second bus-interface circuit) 105-2 with the memory core (second memory core) 106-2 may be also called "second data bus".

Further, each of the interface circuits 105-1 to 105-4 interfaces the exchange of an access control signal from the FPGA 101 to one of the memory cores 106-1 to 106-4. Each of the interface circuits 105-1 to 105-4 can interface a data signal having an n-bit width.

The select circuit 107-1 is a circuit that sets the path of an access control signal between one of the interface circuits 105-1 and 105-2 and the memory core 106-2 according to a switching signal MODE1 supplied from the external circuit (FPGA 101). In other words, the select circuit 107-1 selects the access control signal (first access control signal) supplied to the interface circuit 105-1 or the access control signal (second access control signal) supplied to the interface circuit 105-2 according to the externally-supplied switching signal MODE1 and outputs the selected access control signal to the memory core 106-2. In the example shown in FIG. 1, an H-level switching signal MODE1 is supplied from the FPGA 101. Therefore, the select circuit 107-1 sets the path of an access control signal between the interface circuit 105-2 and the memory core 106-2. That is, the select circuit 107-1 selects the access control signal supplied to the interface circuit 105-2 and outputs that access control signal to the memory core 106-2.

The path of an access control signal is also set between the interface circuit 105-1 and the memory core 106-1. Therefore, the access control signal (first access control signal) is input to the memory core 106-1 through the interface circuit 105-1.

The select circuit 107-3 is a circuit that sets the path of an access control signal between one of the interface circuits 105-3 and 105-4 and the memory core 106-4 according to the switching signal MODE1 supplied from the external circuit (FPGA 101). In other words, the select circuit 107-3 selects the access control signal supplied to the interface circuit 105-3 or the access control signal supplied to the interface circuit 105-4 according to the externally-supplied switching signal MODE1 and outputs the selected access control signal to the memory core 106-4. In the example shown in FIG. 1, an H-level switching signal MODE1 is supplied from the FPGA 101. Therefore, the select circuit 107-3 sets the path of an access control signal between the interface circuit 105-4 and the memory core 106-4. That is, the select circuit 107-3 selects the access control signal supplied to the interface circuit 105-4 and outputs that access control signal to the memory core 106-4.

The path of the access control signal is also set between the interface circuit 105-3 and the memory core 106-3. Therefore, the access control signal is input to the memory core 106-3 through the interface circuit 105-3.

By programming the FPGA 101, the FPGA 101 includes four independent functional blocks 103-1 to 103-4, and interface circuits 104-1 to 104-4.

Note that in this embodiment, an example in which each of the functional blocks 103-1 to 103-4 transmits/receives data having the same data width as the maximum data width that each memory core can process is explained. That is, each of the functional blocks 103-1 to 103-4 transmits/receives data having a data width of n bits.

The interface circuits 104-1 to 104-4 interface the exchanges of data signals and the exchanges of access control signals performed between the functional blocks 103-1 to 103-4, respectively, and the memory 102. Each of the interface circuits 104-1 to 104-4 can interface a data signal having an n-bit width. Note that though they are not shown in the drawings, the FPGA 101 also includes a circuit that generates a clock signal supplied to the functional blocks 103-1 to 103-4 and the memory 102, and a circuit that generates a switching signal MODE1 (which is explained later).

The functional blocks 103-1 to 103-4 access the memory 102 for the purpose of temporarily saving work data or the like. In the example shown in FIG. 1, the functional blocks 103-1 to 103-4 exchange data signals and access control signals with the memory cores 106-1 to 106-4 respectively disposed in the memory 102.

For example, when data is to be written into the memory, the functional block 103-1 transmits data DQ[n−1:0]_A having an n-bit width and a corresponding access control signal CTL_A to the memory 102 through the interface circuit 104-1. In the memory 102, the memory core 106-1 receives the data DQ[n−1:0]_A having an n-bit width and the access control signal CTL_A through the interface circuit 105-1. As a result, the data DQ[n−1:0]_A having an n-bit width is written into the memory core 106-1.

Similarly, the functional block 103-2 transmits data DQ[n−1:0]_B having an n-bit width and a corresponding access control signal CTL_B to the memory 102 through the interface circuit 104-2. In the memory 102, the memory core 106-2 receives the data DQ[n−1:0]_B having an n-bit width and the access control signal CTL_B through the interface circuit 105-2. As a result, the data DQ[n−1:0]_B having an n-bit width is written into the memory core 106-2. Similarly, the functional block 103-3 transmits data DQ[n−1:0]_C having an n-bit width and a corresponding access control signal CTL_C to the memory 102 through the interface circuit 104-3. In the memory 102, the memory core 106-3 receives the data DQ[n−1:0]_C having an n-bit width and the access control signal CTL_C through the interface circuit 105-3. As a result, the data DQ[n−1:0]_C having an n-bit width is written into the memory core 106-3. Similarly, the functional block 103-4 transmits data DQ[n−1:0]_D having an n-bit width and a corresponding access control signal CTL_D to the memory 102 through the interface circuit 104-4. In the memory 102, the memory core 106-4 receives the data DQ[n−1:0]_D having an n-bit width and the access control signal CTL_D through the interface circuit 105-4. As a result, the data DQ[n−1:0]_D having an n-bit width is written into the memory core 106-4.

Further, when data is to be read from the memory, the functional block 103-1 transmits an access control signal CTL_A to the memory 102 through the interface circuit 104-1. In the memory 102, the memory core 106-1 receives the access control signal CTL_A through the interface circuit 105-1. As a result, data DQ[n−1:0]_A having an n-bit width is read from the memory core 106-1.

Similarly, the functional block 103-2 transmits an access control signal CTL_B to the memory 102 through the interface circuit 104-2. In the memory 102, the memory core 106-2 receives the access control signal CTL_B through the interface circuit 105-2. As a result, data DQ[n−1:0]_B having an n-bit width is read from the memory core 106-2. The functional block 103-3 transmits an access control signal CTL_C to the memory 102 through the interface circuit 104-3. In the memory 102, the memory core 106-3 receives the access control signal CTL_C through the interface circuit 105-3. As a result, data DQ[n−1:0]_C having an n-bit width is read from the memory core 106-3. Similarly, the functional block 103-4 transmits an access control signal CTL_D to the memory 102 through the interface circuit 104-4. In the memory 102, the memory core 106-4 receives the access control signal CTL_D through the interface circuit 105-4. As a result, data DQ[n−1:0]_D having an n-bit width is read from the memory core 106-4.

In this manner, the data DQ_A having an n-bit width and the access control signal CTL_A are exchanged between the functional block 103-1 and the memory core 106-1 in the example shown in FIG. 1. The data DQ_B having an n-bit width and the access control signal CTL_B are exchanged between the functional block 103-2 and the memory core 106-2. The data DQ_C having an n-bit width and the access control signal CTL_C are exchanged between the functional block 103-3 and the memory core 106-3. Further, the data DQ_D having an n-bit width and the access control signal CTL_D are exchanged between the functional block 103-4 and the memory core 106-4.

As described above, each of the functional blocks 103-1 to 103-4 exchanges a data signal with a different one of the memory cores 106-1 to 106-4. Therefore, in the memory 102 according to this embodiment, each memory core is never accessed from two or more functional blocks simultaneously. Therefore, there is no need to perform arbitration by using an arbitration circuit, and thus making it possible to prevent the deterioration of the data processing performance.

Note that although the example shown in FIG. 1 is explained by using an example in which the FPGA 101 includes four functional blocks 103-1 to 103-4 each of which transmits/receives data having an n-bit width, the present invention is not limited to this configuration. That is, the number of the functional blocks can be arbitrarily determined. It should be noted that when the FPGA 101 includes three functional blocks 103-1 to 103-3 each of which transmits/receives data having an n-bit width, the data signal and the like is not supplied from the FPGA 101 to the interface circuit 105-4 of the memory 102. In this case, a fixed signal (voltage of a predetermined logic level) is supplied to the interface circuit 105-4. By doing so, it is possible to prevent the input terminal from becoming an opened state and thereby prevent the floating state. Note that whether a fixed signal is supplied to each of the interface circuits 105-1 to 105-4 or not is determined according to the switching signal MODE1.

Further, the FPGA 101 generates a switching signal MODE1 having a signal level that is determined based on the data width of data transmitted by a functional block, for example, and outputs the generated switching signal MODE1 to the memory 102. Alternatively, the FPGA 101 generates a switching signal MODE1 having a signal level that is determined based on the number of functional blocks that need to access the memory 102, and outputs the generated switching signal MODE1 to the memory 102. Further, the FPGA 101 generates a clock signal CK and outputs the generated clock signal CK to the memory 102. The memory cores 106-1 to 106-4 operate in synchronization with this clock signal CK.

Figure 2A:
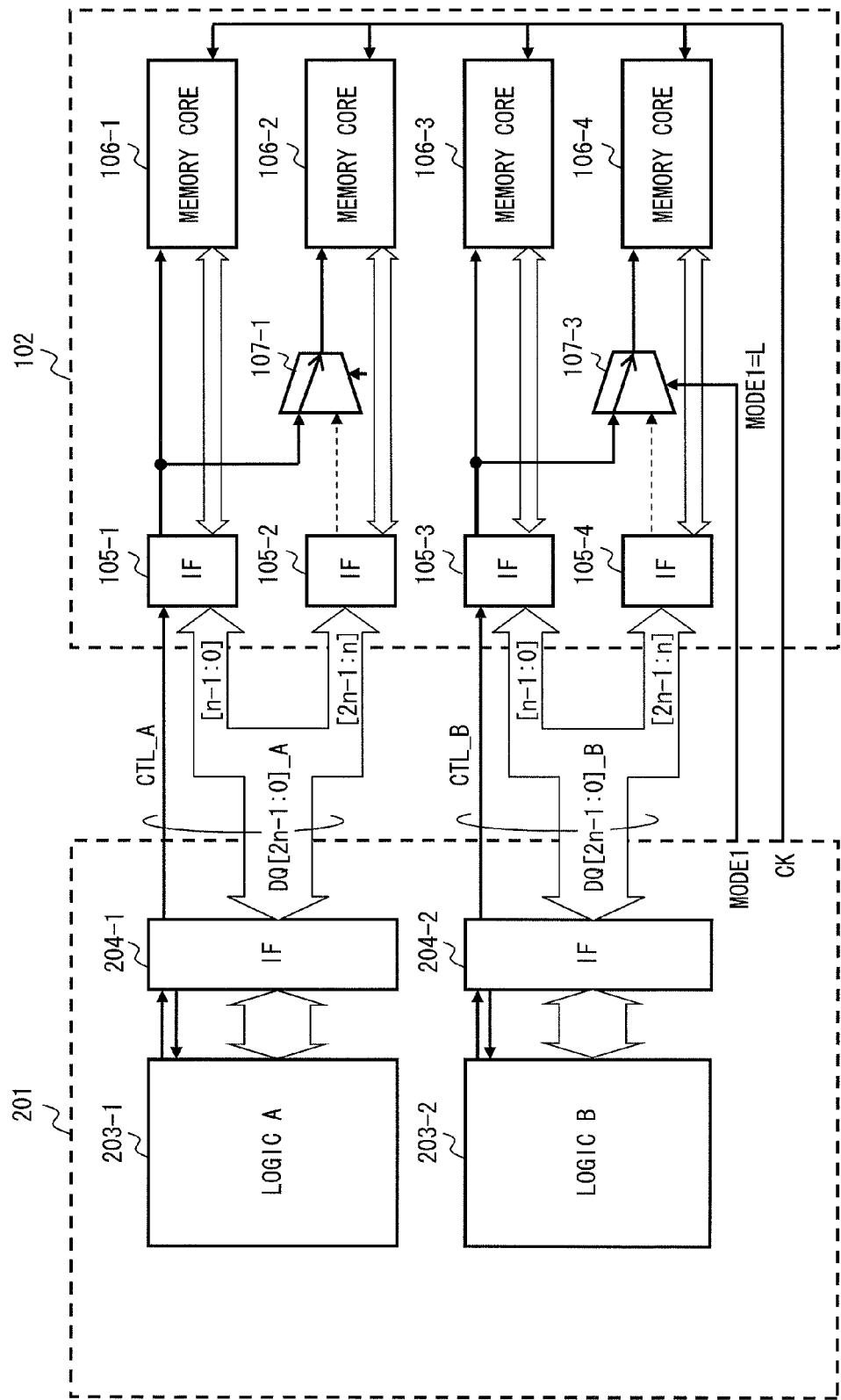
FIG. 2A is a block diagram showing a semiconductor integrated circuit according to a first embodiment of the present invention.

A semiconductor integrated circuit shown in FIG. 2A is obtained by reprogramming the FPGA 101 shown in FIG. 1, and the semiconductor integrated circuit shown in FIG. 2A is hereinafter called "FPGA 201". Specifically, the FPGA 201 is reprogrammed so that it has two independent functional blocks 203-1 and 203-2 and interface circuits 204-1 and 204-2. The following explanation is made with particular emphasis on the different points from the semiconductor integrated circuit shown in FIG. 1

Note that in this embodiment, an example in which each of the functional blocks 203-1 and 203-2 transmits/receives data having a data width larger than the maximum data width that each memory core can process is explained. Specifically, each of the functional blocks 203-1 and 203-2 transmits/receives data having a data width of 2n bits. Further, each of the interface circuits 204-1 and 204-2 can interface a data signal having a 2n-bit width.

In the example shown in FIG. 2A, an L-level switching signal MODE1 is supplied from the FPGA 201 to the memory 102. Therefore, the select circuit 107-1 sets the path of an access control signal between the interface circuit 105-1 and the memory core 106-2. That is, the select circuit 107-1 selects the access control signal supplied to the interface circuit 105-1 and outputs that access control signal to the memory core 106-2. Further, the select circuit 107-3 sets the path of an access control signal between the interface circuit 105-3 and the memory core 106-4. That is, the select circuit 107-3 selects the access control signal supplied to the interface circuit 105-3 and outputs that access control signal to the memory core 106-4.

That is, the paths of the access control signal are set between the interface circuit 105-1 and the memory cores 106-1 and 106-2. Further, the paths of the access control signal are set between the interface circuit 105-3 and the memory cores 106-3 and 106-4. Note that similarly to the case shown in FIG. 1, the paths of data signals are set between the interface circuits 105-1 to 105-4 and the memory cores 106-1 to 106-4 in a one-to-one relation.

In the FPGA 201, the interface circuits 204-1 and 204-2 interface the exchanges of data signals and the exchanges of access control signals performed between the functional blocks 203-1 and 203-2, respectively, and the memory 102.

The functional blocks 203-1 and 203-2 access the memory 102 for the purpose of temporarily saving work data or the like. In the example shown in FIG. 2A, the functional block 203-1 exchanges a data signal and an access control signal with the memory cores 106-1 and 106-2 disposed in the memory 102. Further, the functional block 203-2 exchanges a data signal and an access control signal with the memory cores 106-3 and 106-4 disposed in the memory 102.

For example, when data is to be written into the memory, the functional block 203-1 transmits data DQ[2n−1:0]_A having a 2n-bit width and a corresponding access control signal CTL_A to the memory 102 through the interface circuit 204-1. In the memory 102, the memory core 106-1 receives the data DQ[n−1:0]_A having an n-bit width through the interface circuit 105-1 and the memory core 106-2 receives the remaining data DQ[2n−1:n]_A having an n-bit width through the interface circuit 105-2. In this process, the access control signal CTL_A transmitted from the functional block 203-1 is supplied only to the interface circuit 105-1. Then, the access control signal CTL_A is input to both of the memory cores 106-1 and 106-2 through the interface circuit 105-1. As a result, the data DQ[n−1:0]_A having an n-bit width is written into the memory core 106-1 and the remaining data DQ[2n−1:n]_A having an n-bit width is written into the memory core 106-2.

Similarly, the functional block 203-2 transmits data DQ[2n−1:0]_B having a 2n-bit width and a corresponding access control signal CTL_B to the memory 102 through the interface circuit 204-2. In the memory 102, the memory core 106-3 receives the data DQ[n−1:0]_B having an n-bit width through the interface circuit 105-3 and the memory core 106-4 receives the remaining data DQ[2n−1:n]_B having an n-bit width through the interface circuit 105-4. In this process, the access control signal CTL_B transmitted from the functional block 203-2 is supplied only to the interface circuit 105-3. Then, the access control signal CTL_B is input to both of the memory cores 106-3 and 106-4 through the interface circuit 105-3. As a result, the data DQ[n−1:0]_B having an n-bit width is written into the memory core 106-3 and the remaining data DQ[2n−1:n]_B having an n-bit width is written into the memory core 106-4.

Further, when data is to be read from the memory, the functional block 203-1 transmits an access control signal CTL_A to the memory 102 through the interface circuit 204-1. The access control signal CTL_A is supplied only to the interface circuit 105-1. Then, the access control signal CTL_A is input to both of the memory cores 106-1 and 106-2 through the interface circuit 105-1. As a result, the data DQ[n−1:0]_A having an n-bit width is read from the memory core 106-1 and the remaining data DQ[2n−1: n]_A having an n-bit width is read from the memory core 106-2.

Similarly, the functional block 203-1 transmits an access control signal CTL_B to the memory 102 through the interface circuit 204-2. The access control signal CTL_B is supplied only to the interface circuit 105-3. Then, the access control signal CTL_B is input to both of the memory cores 106-3 and 106-4 through the interface circuit 105-3. As a result, the data DQ[n−1:0]_B having an n-bit width is read from the memory core 106-3 and the remaining data DQ[2n−1:n]_B having an n-bit width is read from the memory core 106-4.

In this manner, the data DQ_A having a 2n-bit width and the access control signal CTL_A are exchanged between the functional block 203-1 and the memory cores 106-1 and 106-2. The data DQ_B having a 2n-bit width and the access control signal CTL_B are exchanged between the functional block 203-3 and the memory core 106-3 and 106-4.

As described above, each of the functional blocks 203-1 and 203-2 exchanges a data signal with different ones of the memory cores 106-1 to 106-4. Therefore, in the memory 102 according to this embodiment, each memory core is never accessed from two or more functional blocks simultaneously. Therefore, there is no need to perform arbitration by using an arbitration circuit, and thus making it possible to prevent the deterioration of the data processing performance.

Further, the number of components in the semiconductor integrated circuit according to an aspect of the present invention shown in FIGS. 1 and 2A is smaller in comparison to that of the semiconductor integrated circuit in the related art shown in FIG. 12. Specifically, the number of components in the semiconductor integrated circuit shown in FIGS. 1 and 2A is two, i.e., one FPGA 101 and one memory 102. As a result, in the semiconductor integrated circuit according to an aspect of the present invention, the number of signal lines connected between these chips also becomes smaller in comparison to the related art, and thereby making the circuit board less congested with the wiring lines. In particular, as in the case of the example shown in FIG. 2A, even when the data width of data transmitted/received by the functional block is large and the data is thus divided and supplied through a plurality of interface circuits located in the memory, the access control signal transmitted from that functional block is supplied to only one interface circuit located in the memory. As a result, in the semiconductor integrated circuit according to an aspect of the present invention, the length of signal line(s) that is used to transmit the access control signal(s) decreases in comparison to the related art, and thus making the circuit board less congested with the wiring lines. Consequently, in the semiconductor integrated circuit according to an aspect of the present invention, it is possible to facilitate the adjustment of timings, the control of the characteristics such as crosstalk, and so on in comparison to the related art.

Further, in the semiconductor integrated circuit according to an aspect of the present invention, even when a functional block is to be replaced by a different functional block that transmits/receives data having a larger data width after the system board is constructed, there is no need to change the wiring lines on the circuit board. Therefore, in contrast to the related art, there is no need to construct a different system board in the semiconductor integrated circuit according to an aspect of the present invention, and thus making it possible to prevent the increase in the number of design processes.

Note that although the example shown in FIG. 2A is explained by using an example in which the FPGA 201 includes two functional blocks 203-1 and 203-2 each of which transmits/receives data having a 2n-bit width, the present invention is not limited to this configuration. That is, the number of the functional blocks can be arbitrarily determined. It should be noted that when the FPGA 201 includes only one functional block 203-1 which transmits/receives data having a 2n-bit width, the data signal and the like is not supplied from the FPGA 201 to the interface circuits 105-3 and 105-4 of the memory 102. In this case, a fixed signal (voltage of a predetermined logic level) is supplied to the interface circuits 105-3 and 105-4. By doing so, it is possible to prevent the input terminal from becoming an opened state and thereby prevent the floating state. Note that whether a fixed signal is supplied to each of the interface circuits 105-1 to 105-4 or not is determined according to the switching signal MODE1.

(Specific Configuration Example of Memory 102)

Figure 3:
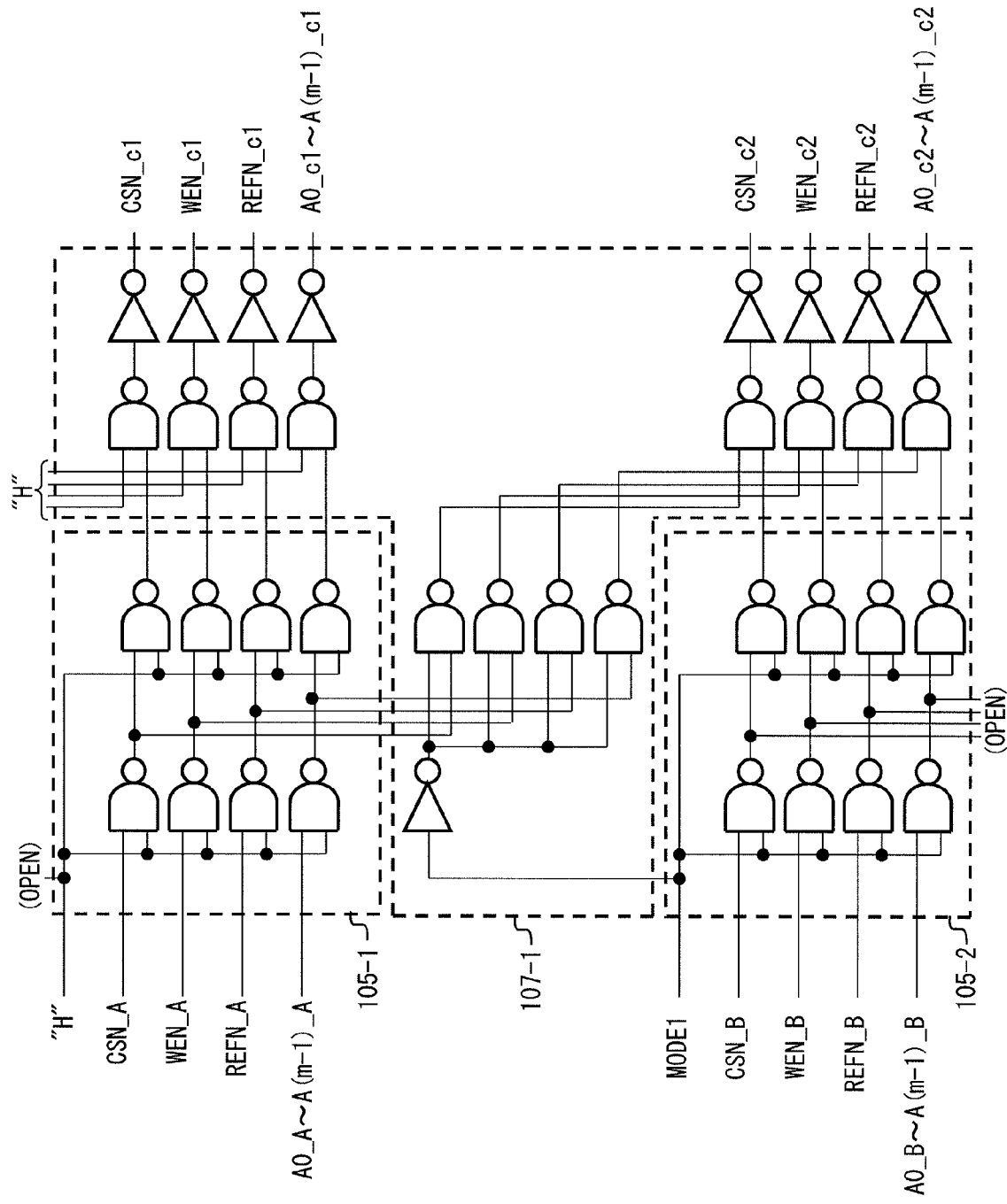
FIG. 3 is a circuit diagram showing a part of a memory according to a first embodiment of the present invention.

Next, a specific configuration example of the memory 102 is explained with reference to FIG. 3. FIG. 3 is a circuit diagram showing part of the interface circuits 105-1 and 105-2 and the select circuit 107-1 disposed in the memory 102 shown in FIGS. 1 and 2A. FIG. 3 mainly shows part of the circuit configuration along the signal paths of the address signal and the command signal. Note that the interface circuits 105-3 and 105-4 and the select circuit 107-3 have a similar circuit configuration to that of the interface circuits 105-1 and 105-2 and the select circuit 107-1.

As shown in FIG. 3, each of the interface circuits 105-1 and 105-2 and the select circuit 107-1 is composed of a plurality of logic gates. Note that in the example shown in FIG. 3, the interface circuits have an identical circuit configuration to each other in order to make their characteristics as similar as possible. Further, in FIG. 3, new symbols are assigned to each of the two access control signals output from the select circuit 107-1 in order to differentiate them in a more specific manner.

As shown in FIG. 3, a chip select signal CSN_A, a write enable signal WEN_A, and a refresh signal REFN_A are supplied to the interface circuit 105-1 as the command signal. Further, an address signal A0_A to A(m−1)_A having an m-bit width (m is a natural number) is also supplied to the interface circuit 105-1. The signal group consisting of these signals is collectively called "access control signal CTL_A"

Further, a chip select signal CSN_B, a write enable signal WEN_B, and a refresh signal REFN_B can be supplied to the interface circuit 105-2 as the command signal. Further, an address signal A0_B to A(m−1)_B having an m-bit width can be also supplied to the interface circuit 105-2. The signal group consisting of these signals is collectively called "access control signal CTL_B"

The select circuit 107-1 outputs the access control signal CTL_A supplied to the interface circuit 105-1 to the memory core 106-1 as a chip select signal CSN_c1, a write enable signal WEN_c1, a refresh signal REFN_c1, and an address signal A0_c1 to A(m−1)_c1 at all times.

Further, the select circuit 107-1 selects the access control signal CTL_A supplied to the interface circuit 105-1 or the access control signal CTL_B supplied to the interface circuit 105-2 according to the switching signal MODE1 and outputs the selected access control signal to the memory core 106-2 as a chip select signal CSN_c2, a write enable signal WEN_c2, a refresh signal REFN_c2, and an address signal A0_c2 to A(m−1)_c2.

For example, when the switching signal MODE1 is at an H-level, the select circuit 107-1 outputs the access control signal CTL_B supplied to the interface circuit 105-2 to the memory core 106-2 as a chip select signal CSN_c2, a write enable signal WEN_c2, a refresh signal REFN_c2, and an address signal A0_c2 to A(m−1)_c2.

On the other hand, when the switching signal MODE1 is at an L-level, the select circuit 107-1 outputs the access control signal CTL_A supplied to the interface circuit 105-1 to the memory core 106-2 as a chip select signal CSN_c2, a write enable signal WEN_c2, a refresh signal REFN_c2, and an address signal A0_c2 to A(m−1)_c2.

Note that the circuit configuration of the memory 102 shown in FIG. 3 is a mere example, and needless to say, it can be changed to other configurations in which similar processing can be performed.

Second Embodiment

In this embodiment, a first modified example of the memory 102 shown in FIGS. 1 and 2A is explained with reference to FIG. 2B. A semiconductor integrated circuit shown in FIG. 2B includes an FPGA 201*b* and a memory 102*b*, which is a modified example of the memory 102. Note that a data signal having a 3n-bit width is exchanged between the FPGA 201*b* and the memory 102*b*.

The memory 102*b* is different from the memory 102 in its configuration of the select circuit. Specifically, the memory 102*b* includes a select circuit 107-2 in place of the select circuit 107-3. The other circuit configuration of the memory 102*b* is similar to that of the memory 102, and therefore its explanation is omitted.

The select circuit 107-2 is a circuit that sets the path of an access control signal between one of the interface circuits 105-1 and 105-3 and the memory core 106-3 according to a switching signal MODE1 supplied from the external circuit (FPGA 201*b*). In other words, the select circuit 107-2 selects the access control signal (first access control signal) supplied to the interface circuit 105-1 or the access control signal (third access control signal) supplied to the interface circuit 105-3 according to the externally-supplied switching signal MODE1 and outputs the selected access control signal to the memory core (third memory core) 106-3. In the example shown in FIG. 2B, an L-level switching signal MODE1 is supplied from the FPGA 201*b*. Therefore, the select circuit 107-2 sets the path of an access control signal between the interface circuit 105-1 and the memory core 106-3. That is, the select circuit 107-2 selects the access control signal supplied to the interface circuit 105-1 and outputs that access control signal to the memory core 106-3.

Note that if an H-level switching signal MODE1 is supplied from the FPGA 201*b*, the select circuit 107-2 sets the path of an access control signal between the interface circuit 105-3 and the memory core 106-3. That is, the select circuit 107-2 selects the access control signal supplied to the interface circuit 105-3 and outputs that access control signal to the memory core 106-3.

Further, as described previously, when the switching signal MODE1 is at an L-level, the select circuit 107-1 sets the path of an access control signal between the interface circuit 105-1 and the memory core 106-2. That is, the select circuit 107-1 selects the access control signal supplied to the interface circuit 105-1 and outputs that access control signal to the memory core 106-2.

That is, the paths of the access control signal are set between the interface circuit 105-1 and the memory cores 106-1 to 106-3. Therefore, the common access control signal is input to each of the memory cores 106-1 to 106-3 through the interface circuit 105-1. Further, the path of another access control signal is set between the interface circuit 105-4 and the memory core 106-4. Therefore, the access control signal is input to the memory core 106-4 through the interface circuit 105-4.

Note that similarly to the case shown in FIGS. 1 and 2A, the paths of data signals are set between the interface circuits 105-1 to 105-4 and the memory cores 106-1 to 106-4 in a one-to-one relation. Note that the data signal path connecting the interface circuit (third bus-interface circuit) 105-3 with the memory core (third memory core) 106-3 may be also called "third data bus".

By programming the FPGA 201*b*, the FPGA 201*b* includes two independent functional blocks 203*b*-1 and 203*b*-2, and interface circuits 204*b*-1 and 204*b*-2. Note that in this embodiment, an example in which the functional block 203*b*-1 transmits/receives data having a 3n-bit data width and the functional block 203*b*-2 transmits/receives data having an n-bit data width is explained.

The interface circuits 204*b*-1 and 204*b*-2 interface the exchanges of data signals and the exchanges of access control signals performed between the functional blocks 203*b*-1 and 203*b*-2, respectively, and the memory 102*b*. The interface circuit 204*b*-1 can interface a data signal having a 3n-bit width and the interface circuit 204*b*-2 can interface a data signal having an n-bit width.

The functional blocks 203*b*-1 and 203*b*-2 access the memory 102*b* for the purpose of temporarily saving work data or the like. In the example shown in FIG. 2B, the functional block 203*b*-1 exchanges a data signal and an access control signal with the memory cores 106-1 to 106-3 disposed in the memory 102*b*. Further, the functional block 203*b*-2 exchanges a data signal and an access control signal with the memory core 106-4 disposed in the memory 102*b*.

For example, when data is to be written into the memory, the functional block 203*b*-1 transmits data DQ[3n−1:0]_A having a 3n-bit width and a corresponding access control signal CTL_A to the memory 102*b* through the interface circuit 204*b*-1. In the memory 102*b*, the memory core 106-1 receives the data DQ[n−1:0]_A having an n-bit width through the interface circuit 105-1 and the memory core 106-2 receives the data DQ[2n−1:n]_A having an n-bit width through the interface circuit 105-2. Further, the memory core 106-3 receives the remaining data DQ[3n−1:2n]_A having an n-bit width through the interface circuit 105-3. In this process, the access control signal CTL_A transmitted from the functional block 203*b*-1 is supplied only to the interface circuit 105-1. Then, the access control signal CTL_A is input to each of the memory cores 106-1 to 106-3 through the interface circuit 105-1. As a result, the data DQ[n−1:0]_A having an n-bit width is written into the memory core 106-1 and the data DQ[2n−1:n]_A having an n-bit width is written into the memory core 106-2. Further, the remaining data DQ[3n−1:2n]_A having an n-bit width is written into the memory core 106-3.

Further, the functional block 203b-2 transmits data DQ[n−1:0]_B having an n-bit width and a corresponding access control signal CTL_B to the memory 102b through the interface circuit 204b-2. In the memory 102b, the memory core 106-4 receives the data DQ[n−1:0]_B having an n-bit width and the corresponding access control signal CTL_B through the interface circuit 105-4. As a result, the data DQ[n−1:0]_B having an n-bit width is written into the memory core 106-4.

Further, when data is to be read from the memory, the functional block 203b-1 transmits an access control signal CTL_A to the memory 102b through the interface circuit 204b-1. The access control signal CTL_A transmitted from the functional block 203b-1 is supplied only to the interface circuit 105-1. Then, the access control signal CTL_A is input to each of the memory cores 106-1 to 106-3 through the interface circuit 105-1. As a result, the data DQ[n−1:0]_A having an n-bit width is read from the memory core 106-1 and the data DQ[2n−1:n]_A having an n-bit width is read from the memory core 106-2. Further, the remaining data DQ[3n−1:2n]_A having an n-bit width is read from the memory core 106-3.

Further, the functional block 203b-2 transmits an access control signal CTL_B to the memory 102b through the interface circuit 204b-2. In the memory 102b, the memory core 106-4 receives the access control signal CTL_B through the interface circuit 105-4. As a result, the data DQ[n−1:0]_B having an n-bit width is read from the memory core 106-4.

Figure 2B:
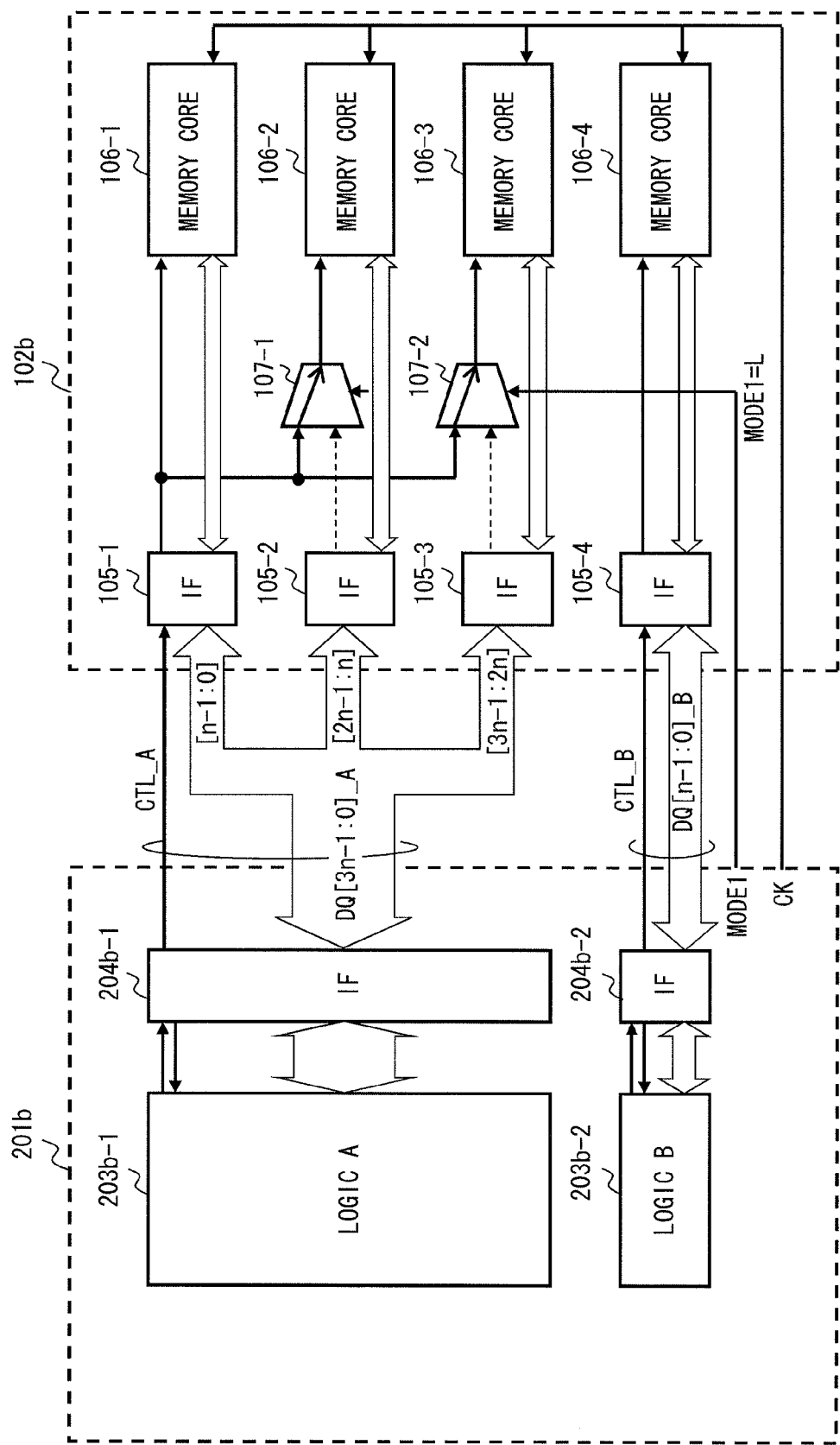
FIG. 2B is a block diagram showing a semiconductor integrated circuit according to a second embodiment of the present invention.

In this manner, the data DQ_A having a 3n-bit width and the access control signal CTL_A are exchanged between the functional block 203b-1 and the memory cores 106-1 to 106-3 in the example shown in FIG. 2B. The data DQ_B having an n-bit width and the access control signal CTL_B are exchanged between the functional block 203b-2 and the memory core 106-4. In this process, each access control signal is supplied to only one of the interface circuits of the memory 102b.

As described above, even in the configuration in which a data signal having a 3n-bit width is exchanged, the memory 102b and the semiconductor integrated circuit including thereof according to this embodiment can achieve similar advantageous effects to those of the first embodiment.

Third Embodiment

In this embodiment, a second modified example of the memory 102 shown in FIGS. 1 and 2A is explained with reference to FIG. 2C. A semiconductor integrated circuit shown in FIG. 2C includes an FPGA 201c and a memory 102c, which is a modified example of the memory 102. Note that a data signal having a 4n-bit width is exchanged between the FPGA 201c and the memory 102c.

The memory 102c is different from the memory 102 in its configuration of the select circuit. Specifically, the memory 102c includes three select circuits 107-1 to 107-3. The circuit configuration and operation of each of the select circuits 107-1 to 107-3 are already explained above, and therefore their explanation is omitted.

In the example shown in FIG. 2C, an L-level switching signal MODE1 is supplied from the FPGA 201c. Therefore, the select circuit 107-1 sets the path of an access control signal between the interface circuit 105-1 and the memory core 106-2 and the select circuit 107-2 sets the path of an access control signal between the interface circuit 105-1 and the memory core 106-3. Further, the select circuit 107-3 sets the path of an access control signal between the interface circuit 105-1 and the memory core 106-4. That is, the paths of the access control signal are set between the interface circuit 105-1 and the memory cores 106-1 to 106-4. Therefore, the common access control signal is input to each of the memory cores 106-1 to 106-4 through the interface circuit 105-1.

Note that similarly to the case shown in FIGS. 1 and 2A, the paths of data signals are set between the interface circuits 105-1 to 105-4 and the memory cores 106-1 to 106-4 in a one-to-one relation.

By programming the FPGA 201c, the FPGA 201c includes one independent functional block 203c-1 and an interface circuit 204c-1. Note that in this embodiment, an example in which the functional block 203c-1 transmits/receives data having a 4n-bit data width is explained.

The interface circuit 204c-1 interfaces the exchange of a data signal and the exchange of an access control signal performed between the functional block 203c-1 and the memory 102c. The interface circuit 204c-1 can interface a data signal having a 4n-bit width.

The functional block 203c-1 accesses the memory 102c for the purpose of temporarily saving work data or the like. In the example shown in FIG. 2C, the functional block 203c-1 exchanges a data signal and an access control signal with the memory cores 106-1 to 106-4 disposed in the memory 102c.

For example, when data is to be written into the memory, the functional block 203c-1 transmits data DQ[4n−1:0]_A having a 4n-bit width and a corresponding access control signal CTL_A to the memory 102c through the interface circuit 204c-1. In the memory 102c, the memory core 106-1 receives the data DQ[n−1:0]_A having an n-bit width through the interface circuit 105-1 and the memory core 106-2 receives the data DQ[2n−1:n]_A having an n-bit width through the interface circuit 105-2. Further, the memory core 106-3 receives the data DQ[3n−1:2n]_A having an n-bit width through the interface circuit 105-3 and the memory core 106-4 receives the remaining data DQ[4n−1:3n]_A having an n-bit width through the interface circuit 105-4. In this process, the access control signal CTL_A transmitted from the functional block 203c-1 is supplied only to the interface circuit 105-1. Then, the access control signal CTL_A is input to each of the memory cores 106-1 to 106-4 through the interface circuit 105-1. As a result, the data DQ[n−1:0]_A having an n-bit width is written into the memory core 106-1 and the data DQ[2n−1:n]_A having an n-bit width is written into the memory core 106-2. Further, the data DQ[3n−1:2n]_A having an n-bit width is written into the memory core 106-3 and the remaining data DQ[4n−1:3n]_A having an n-bit width is written into the memory core 106-4.

Further, when data is to be read from the memory, the functional block 203c-1 transmits an access control signal CTL_A to the memory 102c through the interface circuit 204c-1. The access control signal CTL_A transmitted from the functional block 203c-1 is supplied only to the interface circuit 105-1. Then, the access control signal CTL_A is input to each of the memory cores 106-1 to 106-4 through the interface circuit 105-1. As a result, the data DQ[n−1:0]_A having an n-bit width is read from the memory core 106-1 and the data DQ[2n−1:n]_A having an n-bit width is read from the memory core 106-2. Further, the data DQ[3n−1:2n]_A having an n-bit width is read from the memory core 106-3 and the remaining data DQ[4n−1:3n]_A having an n-bit width is read from the memory core 106-4.

In this manner, the data DQ_A having a 4n-bit width and the access control signal CTL_A are exchanged between the functional block 203c-1 and the memory cores 106-1 to 106-4 in the example shown in FIG. 2C. In this process, the access control signal CTL_A is supplied to only one of the interface circuits of the memory 102b.

As described above, even in the configuration in which a data signal having a 4n-bit width is exchanged, the memory 102c and the semiconductor integrated circuit including thereof according to this embodiment can achieve similar advantageous effects to those of the first embodiment.

Fourth Embodiment

Figure 4:
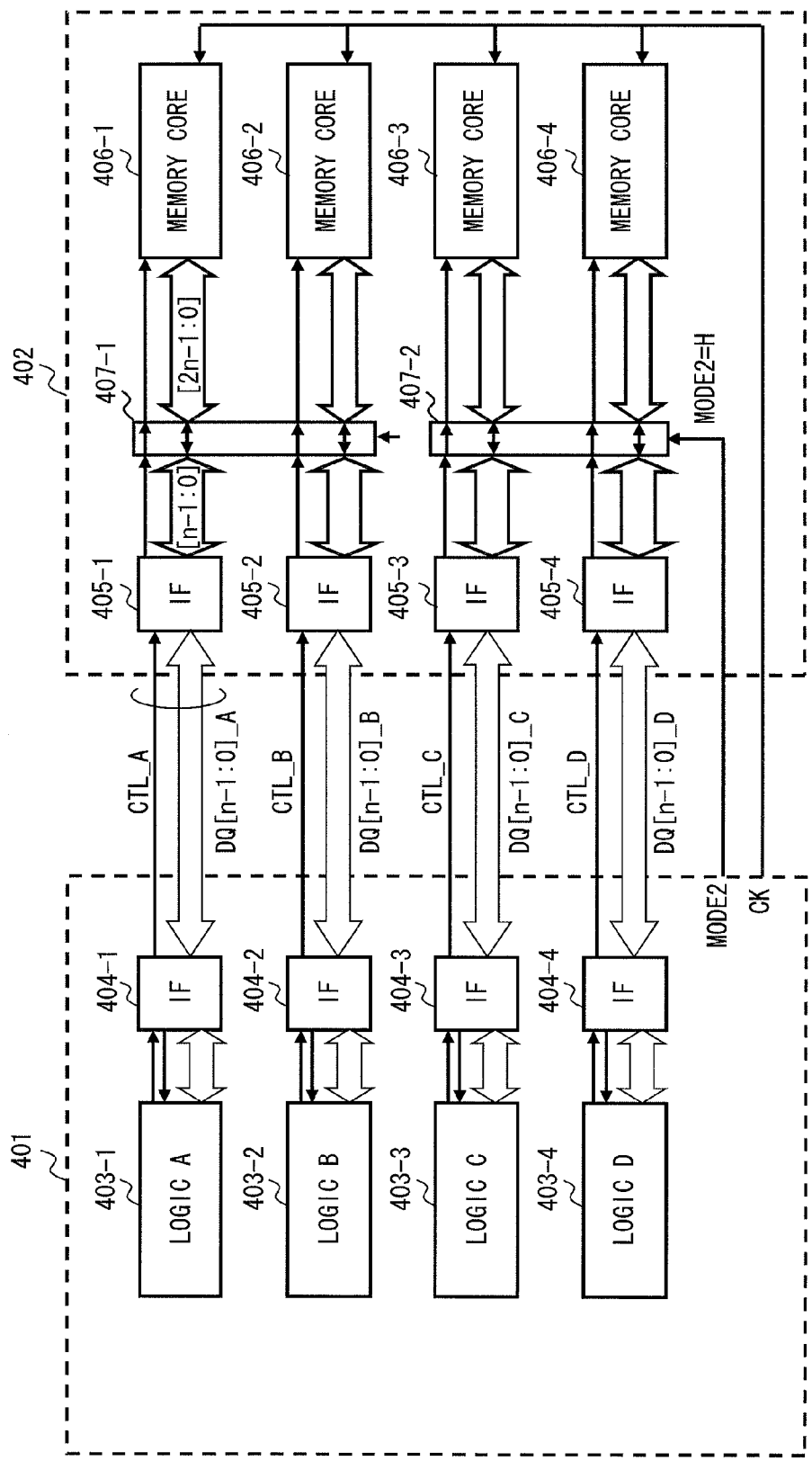
FIG. 4 is a block diagram showing a semiconductor integrated circuit according to a fourth embodiment of the present invention.

FIG. 4 is a block diagram showing a semiconductor integrated circuit including a memory (semiconductor apparatus) according to a fourth embodiment of the present invention. In the memories according to first to third embodiments, when data having a large data width is transmitted/received by a functional block, there is a possibility that the power consumption increases because data reading/writing are performed simultaneously in a plurality of memory cores. In contrast to this, in a memory according to this embodiment, the increase of the power consumption is prevented even when data having a large data width is transmitted/received by a functional block because data reading/writing is not performed simultaneously in a plurality of memory cores. The semiconductor integrated circuit is explained hereinafter in a more detailed manner.

A semiconductor integrated circuit shown in FIG. 4 includes an FPGA 401 and a memory 402. Note that the FPGA 401 has a similar circuit configuration to that of the FPGA 101 shown in FIG. 1. Functional blocks 403-1 to 403-4 correspond to the functional blocks 103-1 to 103-4, respectively, shown in FIG. 1. Interface circuits 404-1 to 404-4 correspond to the interface circuits 104-1 to 104-4, respectively, shown in FIG. 1. Therefore, each of the functional blocks 403-1 to 403-4 transmits/receives data having an n-bit data width.

Interface circuits 405-1 to 405-4 of the memory 402 correspond to the interface circuits 105-1 to 105-4, respectively, shown in FIG. 1. Memory cores 406-1 to 406-4 correspond to the memory cores 106-1 to 106-4, respectively, shown in FIG. 1. Note that in this embodiment, an example in which each of the memory cores 406-1 to 406-4 can simultaneously read or write data having a data width of 2n bits at the maximum is explained.

Further, when compared with the memory 102 shown in FIG. 1, the memory 402 includes select circuits 407-1 and 407-2 in place of the select circuits 107-1 and 107-3. The following explanation is made with particular emphasis on the select circuits 407-1 and 407-2.

The select circuit 407-1 is a circuit that sets the paths of data signals and access control signals between the interface circuits 405-1 and 405-2 and the memory cores 406-1 and 406-2 according to a switching signal MODE2 supplied from the external circuit (FPGA 401). The select circuit 407-2 is a circuit that sets the paths of data signals and access control signals between the interface circuits 405-3 and 405-4 and the memory cores 406-3 and 406-4 according to the externally-supplied switching signal MODE2.

In the example shown in FIG. 4, an H-level switching signal MODE2 is supplied from the FPGA 401. In this case, the select circuit 407-1 sets the paths of a data signal and an access control signal between the interface circuit 405-1 and the memory core 406-1 and also sets the paths of a data signal and an access control signal between the interface circuit 405-2 and the memory core 406-2. Further, the select circuit 407-2 sets the paths of a data signal and an access control signal between the interface circuit 405-3 and the memory core 406-3 and also sets the paths of a data signal and an access control signal between the interface circuit 405-4 and the memory core 406-4.

The functional blocks 403-1 to 403-4 exchange data signals and access control signals with the memory cores 406-1 to 406-4, respectively, disposed in the memory 402. Specifically, the data DQ_A and the access control signal CTL_A are exchanged between the functional block 403-1 and the memory core 406-1. The data DQ_B and the access control signal CTL_B are exchanged between the functional block 403-2 and the memory core 406-2. The data DQ_C and the access control signal CTL_C are exchanged between the functional block 403-3 and the memory core 406-3. Further, the data DQ_D and the access control signal CTL_D are exchanged between the functional block 403-4 and the memory core 406-4.

Note that as described previously, the memory core 406-1 can simultaneously read or write data having a 2n-bit width. In contrast to this, the functional block 403-1, which accesses the memory core 406-1, transmits/receives data having an n-bit width. Therefore, in the memory core 406-1, whether the storage area that is used to store the higher-order n-bits of data is used or the storage area that is used to store the lower-order n-bits of data is used is determined according to, for example, the value of the highest-order bit of the address signal transmitted from the functional block 403-1.

Similarly, the memory core 406-2 can simultaneously read or write data having a 2n-bit width. In contrast to this, the functional block 403-2, which accesses the memory core 406-2, transmits/receives data having an n-bit width. Therefore, in the memory core 406-2, whether the storage area that is used to store the higher-order n-bits of data is used or the storage area that is used to store the lower-order n-bits of data is used is determined according to, for example, the value of the highest-order bit of the address signal transmitted from the functional block 403-2.

Similarly, the memory core 406-3 can simultaneously read or write data having a 2n-bit width. In contrast to this, the functional block 403-3, which accesses the memory core 406-3, transmits/receives data having an n-bit width. Therefore, in the memory core 406-3, whether the storage area that is used to store the higher-order n-bits of data is used or the storage area that is used to store the lower-order n-bits of data is used is determined according to, for example, the value of the highest-order bit of the address signal transmitted from the functional block 403-3.

Similarly, the memory core 406-4 can simultaneously read or write data having a 2n-bit width. In contrast to this, the functional block 403-4, which accesses the memory core 406-4, transmits/receives data having an n-bit width. Therefore, in the memory core 406-4, whether the storage area that is used to store the higher-order n-bits of data is used or the storage area that is used to store the lower-order n-bits of data is used is determined according to, for example, the value of the highest-order bit of the address signal transmitted from the functional block 403-4.

As described above, since the storage areas that cannot be simultaneously accessed are not simultaneously accessed by a plurality of functional blocks in the memory 402 according to this embodiment, there is no need to perform arbitration by using an arbitration circuit, and thus making it possible to prevent the deterioration of the data processing performance.

Note that although the example shown in FIG. 4 is explained by using an example in which the FPGA 401 includes four functional blocks 403-1 to 403-4 each of which transmits/receives data having an n-bit width, the present invention is not limited to this configuration. That is, the number of the functional blocks can be arbitrarily determined. It should be noted that when the FPGA 401 includes three functional blocks 403-1 to 403-3 each of which transmits/receives data having an n-bit width, the data signal and the like is not supplied from the FPGA 401 to the interface circuit 405-4 of the memory 402. In this case, a fixed signal (voltage of a predetermined logic level) is supplied to the interface circuit 405-4. By doing so, it is possible to prevent the input terminal from becoming an opened state and thereby prevent the floating state. Note that whether a fixed signal is supplied to each of the interface circuits 405-1 to 405-4 or not is determined according to the switching signal MODE2.

Figure 5A:
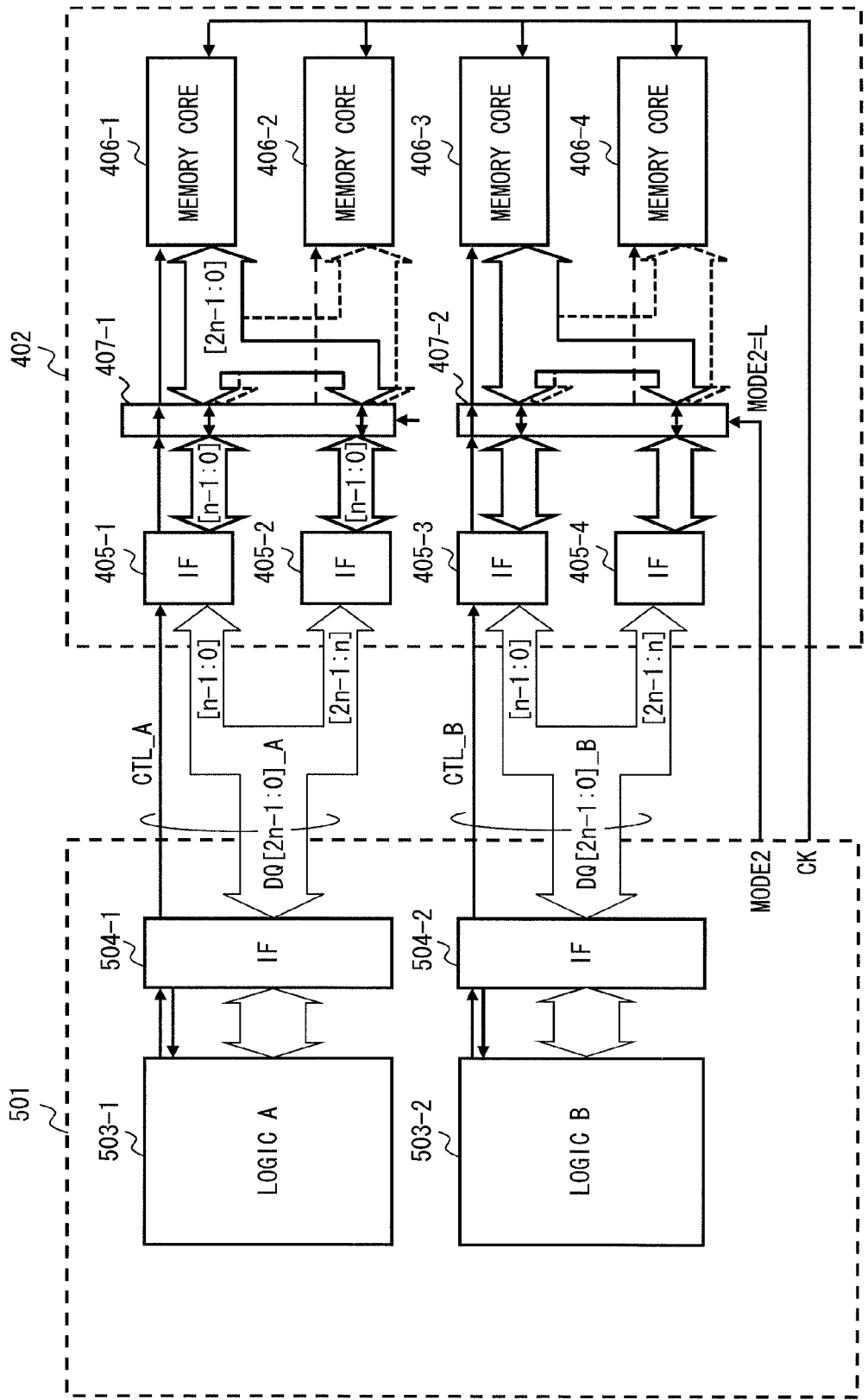
FIG. 5A is a block diagram showing a semiconductor integrated circuit according to a fourth embodiment of the present invention.

A semiconductor integrated circuit shown in FIG. 5A is obtained by reprogramming the FPGA 401 shown in FIG. 4, and the semiconductor integrated circuit shown in FIG. 5A is hereinafter called "FPGA 501". Specifically, the FPGA 501 is reprogrammed so that it has two independent functional blocks 503-1 and 503-2 and interface circuits 504-1 and 504-2.

Note that the FPGA 501 has a similar circuit configuration to that of the FPGA 201 shown in FIG. 2A. Functional blocks 503-1 and 503-2 correspond to the functional blocks 203-1 and 203-2, respectively, shown in FIG. 2A. Interface circuits 504-1 and 504-2 correspond to the interface circuits 204-1 and 204-2, respectively, shown in FIG. 2A. Therefore, each of the functional blocks 503-1 and 503-2 transmits/receives data having a 2n-bit data width.

In the example shown in FIG. 5A, an L-level switching signal MODE2 is supplied from the FPGA 501 to the memory 402. In this case, in the memory 402, the select circuit 407-1 sets a first data signal path between the interface circuits 405-1 and 405-2 and the memory core 406-1 and also sets a first access control signal path between the interface circuit 405-1 and the memory core 406-1. Further, the select circuit 407-1 sets a second data signal path between the interface circuits 405-1 and 405-2 and the memory core 406-2 and also sets a second access control signal path between the interface circuit 405-1 and the memory core 406-1.

More specifically, the first data signal path corresponding to an n-bit width is set between the interface circuit 405-1 and a storage area of the memory core 406-1 that is used to store the lower-order n-bits of data. The first data signal path corresponding to the remaining n-bit width is set between the interface circuit 405-2 and a storage area of the memory core 406-1 that is used to store the higher-order n-bits of data. Further, the first access control signal path is set between the interface circuit 405-1 and the memory core 406-1. Further, the second data signal path corresponding to an n-bit width is set between the interface circuit 405-1 and a storage area of the memory core 406-2 that is used to store the higher-order n-bits of data. The second data signal path corresponding to the remaining n-bit width is set between the interface circuit 405-2 and a storage area of the memory core 406-2 that is used to store the lower-order n-bits of data. Further, the second access control signal path is set between the interface circuit 405-1 and the memory core 406-2.

Note that the decision on which of the paths is used for memory access is made according to, for example, the value of the highest-order bit of the address signal supplied to the interface circuit 405-1. An example in which the first data signal path and the first access control signal path are used for memory access is explained hereinafter. A similar example is also used in the explanation of the specific circuit configuration of the memory 402 shown later. Therefore, in FIG. 5A, the first data signal path and the first access control signal path are drawn by solid lines and other signal paths are drawn by broken lines.

In this case, the functional block 503-1 exchanges a data signal and an access control signal with the memory core 406-1.

Similarly, in the memory 402, the select circuit 407-2 sets a first data signal path between the interface circuits 405-3 and 405-4 and the memory core 406-3 and also sets a first access control signal path between the interface circuit 405-3 and the memory core 406-3. Further, the select circuit 407-2 sets a second data signal path between the interface circuits 405-3 and 405-4 and the memory core 406-4 and also sets a second access control signal path between the interface circuit 405-3 and the memory core 406-4.

More specifically, the first data signal path corresponding to an n-bit width is set between the interface circuit 405-3 and a storage area of the memory core 406-3 that is used to store the lower-order n-bits of data. The first data signal path corresponding to the remaining n-bit width is set between the interface circuit 405-4 and a storage area of the memory core 406-3 that is used to store the higher-order n-bits of data. Further, the first access control signal path is set between the interface circuit 405-3 and the memory core 406-3. Further, the second data signal path corresponding to an n-bit width is set between the interface circuit 405-3 and a storage area of the memory core 406-4 that is used to store the higher-order n-bits of data. The second data signal path corresponding to the remaining n-bit width is set between the interface circuit 405-4 and a storage area of the memory core 406-4 that is used to store the lower-order n-bits of data. Further, the second access control signal path is set between the interface circuit 405-3 and the memory core 406-4.

Note that the decision on which of the paths is used for memory access is made according to, for example, the value of the highest-order bit of the address signal supplied to the interface circuit 405-3. An example in which the first data signal path and the first access control signal path are used for memory access is explained hereinafter. Therefore, in FIG. 5A, the first data signal path and the first access control signal path are drawn by solid lines and other signal paths are drawn by broken lines.

In this case, the functional block 503-2 exchanges a data signal and an access control signal with the memory core 406-3.

For example, when data is to be written into the memory, the functional block 503-1 transmits data DQ[2n−1:0]_A having a 2n-bit width and a corresponding access control signal CTL_A to the memory 402 through the interface circuit 504-1. In the memory 402, data DQ[n−1:0]_A corresponding to an n-bit width is supplied to the interface circuit 405-1, and the remaining data DQ[2n−1:n]_A corresponding to another n-bit width is supplied to the interface circuit 405-2. Then, the data DQ[n−1:0]_A and the data DQ[2n−1:n]_A supplied to the respective interface circuits 405-1 and 405-2 are input to the memory core 406-1 as data DQ[2n−1:0]_A having a 2n-bit width. In this process, the access control signal CTL_A transmitted from the functional block 503-1 is supplied only to the interface circuit 405-1. Then, the access control signal CTL_A is supplied to the memory core 406-1 through the interface circuit 405-1. As a result, the data DQ[2n−1:0]_A having a 2n-bit width is written into the memory core 406-1. In this process, the memory core 406-2 is not operated.

Similarly, the functional block 503-2 transmits data DQ[2n−1:0]_B having a 2n-bit width and a corresponding access control signal CTL_B to the memory 402 through the interface circuit 504-2. In the memory 402, data DQ[n−1:0]_B corresponding to an n-bit width is supplied to the interface circuit 405-3, and the remaining data DQ[2n−1:n]_B corresponding to another n-bit width is supplied to the interface circuit 405-4. Then, the data DQ[n−1:0]_B and the data DQ[2n−1:n]_B supplied to the respective interface circuits 405-3 and 405-4 are input to the memory core 406-3 as data DQ[2n−1:0]_B having a 2n-bit width. In this process, the access control signal CTL_B transmitted from the functional block 503-2 is supplied only to the interface circuit 405-3. Then, the access control signal CTL_B is supplied to the memory core 406-3 through the interface circuit 405-3. As a result, the data DQ[2n−1:0]_B having a 2n-bit width is written into the memory core 406-3. In this process, the memory core 406-4 is not operated.

Further, when data is to be read from the memory, the functional block 503-1 transmits an access control signal CTL_A to the memory 402 through the interface circuit 504-1. The access control signal CTL_A is supplied only to the interface circuit 405-1. Then, the access control signal CTL_A is supplied to the memory core 406-1 through the interface circuit 405-1. As a result, data DQ[2n−1:0]_A having a 2n-bit width is read from the memory core 406-1. Note that the read data DQ[2n−1:0]_A is divided into data DQ[n−1:0]_A having an n-bit width and data DQ[2n−1:n]_A having an n-bit width, and the divided data DQ[n−1:0]_A and data DQ[2n−1:n]_A are transmitted to the functional block 503-1 side through the interface circuits 405-1 and 405-2 respectively. In this process, the memory core 406-2 is not operated.

Similarly, the functional block 503-2 transmits an access control signal CTL_B to the memory 402 through the interface circuit 504-2. The access control signal CTL_B is supplied only to the interface circuit 405-3. Then, the access control signal CTL_B is supplied to the memory core 406-3 through the interface circuit 405-3. As a result, data DQ[2n−1:0]_B having a 2n-bit width is read from the memory core 406-3. Note that the read data DQ[2n−1:0]_B is divided into data DQ[n−1:0]_B having an n-bit width and data DQ[2n−1:n]_B having an n-bit width, and the divided data DQ[n−1:0]_B and data DQ[2n−1:n]_B are transmitted to the functional block 503-2 side through the interface circuits 405-3 and 405-4 respectively. In this process, the memory core 406-4 is not operated.

In this manner, the data DQ_A having a 2n-bit width and the access control signal CTL_A are exchanged between the functional block 503-1 and the memory core 406-1 in the example shown in FIG. 5A. The data DQ_B having a 2n-bit width and the access control signal CTL_B are exchanged between the functional block 503-2 and the memory core 406-3. In this process, each access control signal is supplied to only one of the interface circuits of the memory 402.

As described above, since the storage areas that cannot be simultaneously accessed are not simultaneously accessed by a plurality of functional blocks in the memory 402 according to this embodiment, there is no need to perform arbitration by using an arbitration circuit, and thus making it possible to prevent the deterioration of the data processing performance.

In addition, the memory 402 according to this embodiment can achieve similar advantageous effects to those of the first to third embodiments.

Further, in the memory 402 according to this embodiment, the increase of the power consumption is prevented even when data having a large data width is transmitted/received by a functional block because data reading/writing is not performed simultaneously in a plurality of memory cores.

Note that although the example shown in FIG. 5A is explained by using an example in which the FPGA 501 includes two functional blocks 503-1 and 503-2 each of which transmits/receives data having a 2n-bit width, the present invention is not limited to this configuration. That is, the number of the functional blocks can be arbitrarily determined. It should be noted that when the FPGA 501 includes only one functional block 503-1 which transmits/receives data having a 2n-bit width, the data signal and the like is not supplied from the FPGA 501 to the interface circuits 405-3 and 405-4 of the memory 402. In this case, a fixed signal (voltage of a predetermined logic level) is supplied to the interface circuits 405-3 and 405-4. By doing so, it is possible to prevent the input terminal from becoming an opened state and thereby prevent the floating state. Note that whether a fixed signal is supplied to each of the interface circuits 405-1 to 405-4 or not is determined according to the switching signal MODE2.

(Specific Configuration Example of Memory 402)

Figure 6A:
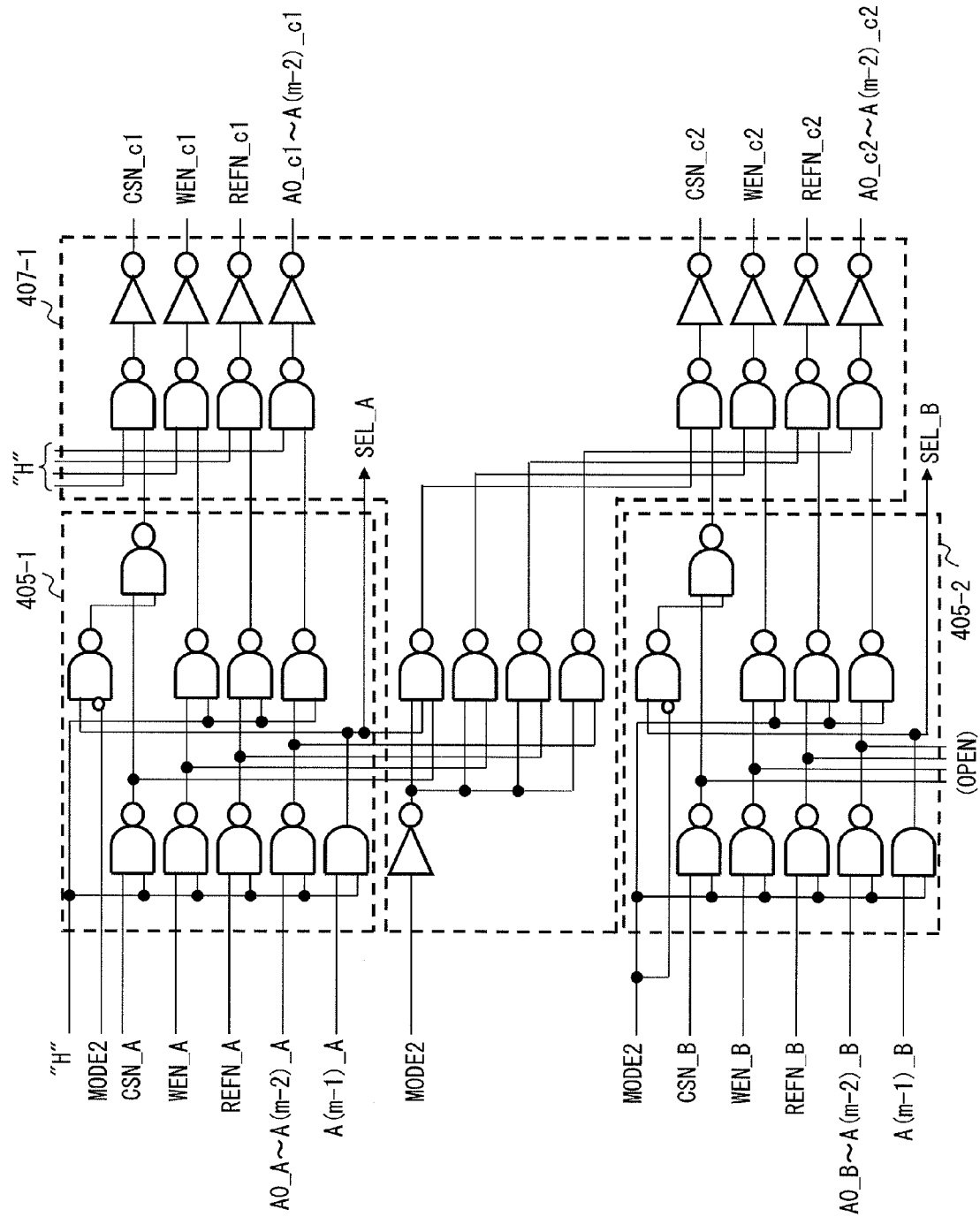
FIG. 6A is a circuit diagram showing a part of a memory according to a fourth embodiment of the present invention.
Figure 6B:
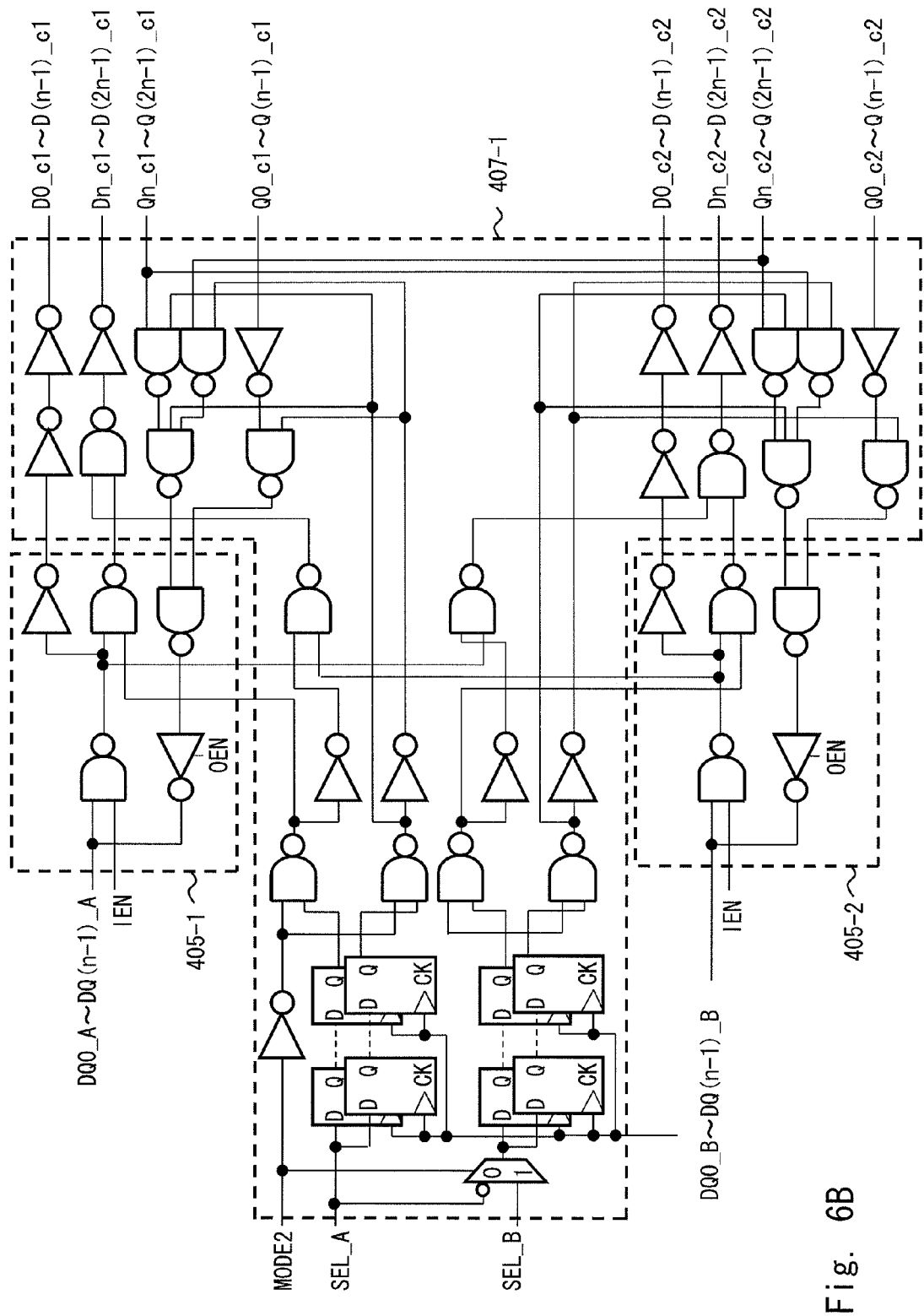
FIG. 6B is a circuit diagram showing a part of a memory according to a fourth embodiment of the present invention.

Next, a specific configuration example of the memory 402 is explained with reference to FIGS. 6A, 6B, 7A and 7B. FIGS. 6A and 6B are circuit diagrams showing part of the interface circuits 405-1 and 405-2 and the select circuit 407-1 disposed in the memory 402 shown in FIGS. 4 and 5A. FIG. 6A mainly shows part of the circuit configuration along the signal paths of the address signal and the command signal and FIG. 6B mainly shows part of the circuit configuration along the signal path of the data signal.

Further, FIGS. 7A and 7B are tables showing relations between the interface circuits 405-1 and 405-2 shown in FIGS. 6A and 6B and the memory cores 406-1 and 406-2. More specifically, FIG. 7A is a table showing an interface signal, which is selected as a first memory core signal (explained later), for each signal level of the switching signal MODE2. FIG. 7B is a table showing an interface signal, which is selected as a second memory core signal (explained later), for each signal level of the switching signal MODE2. Note that in FIGS. 7A and 7B, the signals exchanged between the interface circuits 405-1 and 405-2 and the external circuit (FPGA) are called "interface signals".

The signal path relation between the interface circuits 405-3 and 405-4 and the memory cores 406-3 and 406-4 is similar to the relation between the interface circuits 405-1 and 405-2 and the memory cores 406-1 and 406-2, and therefore its explanation is omitted.

As shown in FIGS. 6A and 6B, the interface circuits 405-1 and 405-2 and the select circuit 407-1 are composed of a plurality of logic gates. Note that in the example shown in FIGS. 6A and 6B, the interface circuits have an identical circuit configuration to each other in order to make their characteristics as similar as possible. Further, in FIGS. 6A and 6B, new symbols are assigned to each of the first and second memory core signals (explained later) in order to differentiate them in a more specific manner.

As shown in FIG. 6A, a chip select signal CSN_A, a write enable signal WEN_A, and a refresh signal REFN_A are supplied to the interface circuit 405-1 as the command signal. Further, an address signal A0_A to A(m−1)_A having an m-bit width (m is a natural number) is also supplied to the interface circuit 405-1. Note that as described previously, the address signal A(m−1)_A at the highest-order bit is used to select a storage area from/into which a data signal is to be read/written. The signal group consisting of these signals is collectively called "access control signal CTL_A"

Further, a chip select signal CSN_B, a write enable signal WEN_B, and a refresh signal REFN_B can be supplied to the interface circuit 405-2 as the command signal. Further, an address signal A-_B to A(m−1)_B having an m-bit width can be also supplied to the interface circuit 405-2. Note that as described previously, the highest-order bit of the address signal A(m−1)_B is used to select a storage area from/into which a data signal is to be read/written. The signal group consisting of these signals is collectively called "access control signal CTL_B"

For example, when the switching signal MODE2 is at an H-level, the select circuit 407-1 outputs the access control signal CTL_A supplied to the interface circuit 405-1 to the memory core 406-1 as a chip select signal CSN_c1, a write enable signal WEN_c1, a refresh signal REFN_c1, and an address signal A0_c1 to A(m−2)_c1 (these signals are shown as "first memory core signal" in FIG. 7A). Further, the select circuit 407-1 outputs the access control signal CTL_B supplied to the interface circuit 405-2 to the memory core 406-2 as a chip select signal CSN_c2, a write enable signal WEN_c2, a refresh signal REFN_c2, and an address signal A0_c2 to A(m−2)_c2 (these signals are shown as "second memory core signal" in FIG. 7B).

On the other hand, when the switching signal MODE2 is at an L-level, the select circuit 407-1 outputs the access control signal CTL_A supplied to the interface circuit 405-1 to the memory core 406-1 as a chip select signal CSN_c1, a write enable signal WEN_c1, a refresh signal REFN_c1, and an address signal A0_c1 to A(m−2)_c1. Note that in this state, the select circuit 407-1 also outputs the access control signal CTL_A supplied to the interface circuit 405-1 to the memory core 406-2 as a chip select signal CSN_c2, a write enable signal WEN_c2, a refresh signal REFN_c2, and an address signal A0_c2 to A(m−2)_c2. However, since this example is explained on the assumption that the memory core 406-1 is selected as the memory core from/into which data is to be read/written according to the value of the address signal A(m−1)_A at the highest-order bit, it is not mentioned in this example.

Next, as shown in FIG. 6B, the interface circuit 405-1 transmits/receives data DQ0_A to DQ(n−1)_A having an n-bit width to/from the external circuit (FPGA). Note that the data DQ0_A to DQ(n−1)_A corresponds to the data DQ[n−1:0]_A shown in FIGS. 4 and 5A. The interface circuit 405-2 transmits/receives data DQ0_B to DQ(n−1)_B having an n-bit width to/from the external circuit (FPGA). Note that the data DQ0_B to DQ(n−1)_B corresponds to the data DQ[n−1:0]_B shown in FIG. 4 or the data DQ[2n−1:n]_A shown in FIG. 5A. The signals IEN and OEN are enable signals that enable data reading and data writing respectively.

For example, when the switching signal MODE2 is at an H-level, the select circuit 407-1 sets the path of a data signal between the interface circuit 405-1 and the memory core 406-1 and also sets the path of a data signal between the interface circuit 405-2 and the memory core 406-2.

As a result, in a data writing operation, data DQ0_A to DQ(n−1)_A having an n-bit width, which is externally supplied to the interface circuit 405-1, is input to (written into) the memory core 406-1 as write data D0_c1 to D(n−1)_c1 (first memory core signal). Data DQ0_B to DQ(n−1)_B having an n-bit width, which is externally supplied to the interface circuit 405-2, is input to (written into) the memory core 406-2 as write data D0_c2 to D(n−1)_c2 (second memory core signal).

Further, in a data reading operation, data Q0_c1 to Q(n−1)_c1 (first memory core signal) having an n-bit width read from the memory core 406-1 is externally output through the interface circuit 405-1 as data DQ0_A to DQ(n−1)_A. Data Q0_c2 to Q(n−1)_c2 (second memory core signal) having an n-bit width read from the memory core 406-2 is externally output through the interface circuit 405-2 as data DQ0_B to DQ(n−1)_B.

On the other hand, when the switching signal MODE2 is at an L-level, the select circuit 407-1 sets a first data signal path between the interface circuits 405-1 and 405-2 and the memory core 406-1. Note that in this state, the select circuit 407-1 also set a second data signal path between the interface circuits 405-1 and 405-2 and the memory core 406-2. However, this example is explained on the assumption that the memory core 406-1 is selected as the memory core from/into which data is to be read/written according to the value of the address signal A(m−1)_A at the highest-order bit. Therefore, the first data signal path is used for the memory access.

As a result, in a data writing operation, the data DQ0_A to DQ(n−1)_A having an n-bit width, which is externally supplied to the interface circuit 405-1, is input to (written into) the memory core 406-1 as write data D0_c1 to D(n−1)_c1. The remaining data DQ0_B to DQ(n−1)_B having an n-bit width (which corresponds to the data DQ[2n−1:n]_A shown in FIG. 5A), which is externally supplied to the interface circuit 405-2, is input to (written into) the memory core 406-1 as write data Dn_c1 to D(2n−1)_c1.

Further, in a data reading operation, the data Q0_c1 to Q(2n−1)_c1 having a 2n-bit width read from the memory core 406-1 is divided into data Q0_c1 to Q(n−1)_c1 having an n-bit width and data Qn_c1 to Q(2n−1)_c1 having an n-bit width, and they are externally output through the interface circuits 405-1 and 405-2 respectively as data DQ0_A to DQ(n−1)_A and data DQ0_B to DQ(n−1)_B (which corresponds to the data DQ[2n−1:n]_A shown in FIG. 5A).

Note that the circuit configurations of the memory 402 shown in FIGS. 6A and 6B are a mere example, and needless to say, they can be changed to other configurations in which similar processing can be performed.

Fifth Embodiment

In this embodiment, a first modified example of the memory 402 shown in FIGS. 4 and 5A is explained with reference to FIG. 5B. A semiconductor integrated circuit shown in FIG. 5B includes an FPGA 501b and a memory 402b, which is a modified example of the memory 402. Note that a data signal having a 3n-bit width is exchanged between the FPGA 501b and the memory 402b.

Note that the FPGA 501b has a similar circuit configuration to that of the FPGA 201b shown in FIG. 2B. Functional blocks 503b-1 and 503b-2 correspond to the functional blocks 203b-1 and 203b-2, respectively, shown in FIG. 2B. Interface circuits 504b-1 and 504b-2 correspond to the interface circuits 204b-1 and 204b-2, respectively, shown in FIG. 2B. Therefore, the functional block 503b-1 transmits/receives data having a 3n-bit data width and the functional block 503b-2 transmits/receives data having an n-bit data width.

The memory 402b is different from the memory 402 in its configuration of the select circuit. Specifically, the memory 402b includes a select circuit 407-3 in place of the select circuits 407-1 and 407-2. Note that in this embodiment, an example in which each of the memory cores 406-1 to 406-4 can simultaneously read or write data having a data width of 3n bits at the maximum is explained.

The select circuit 407-3 is a circuit that sets the paths of data signals and access control signals between the interface circuits 405-1 to 405-3 and the memory cores 406-1 to 406-3 according to a switching signal MODE2 supplied from the external circuit (FPGA 501b).

Figure 5B:
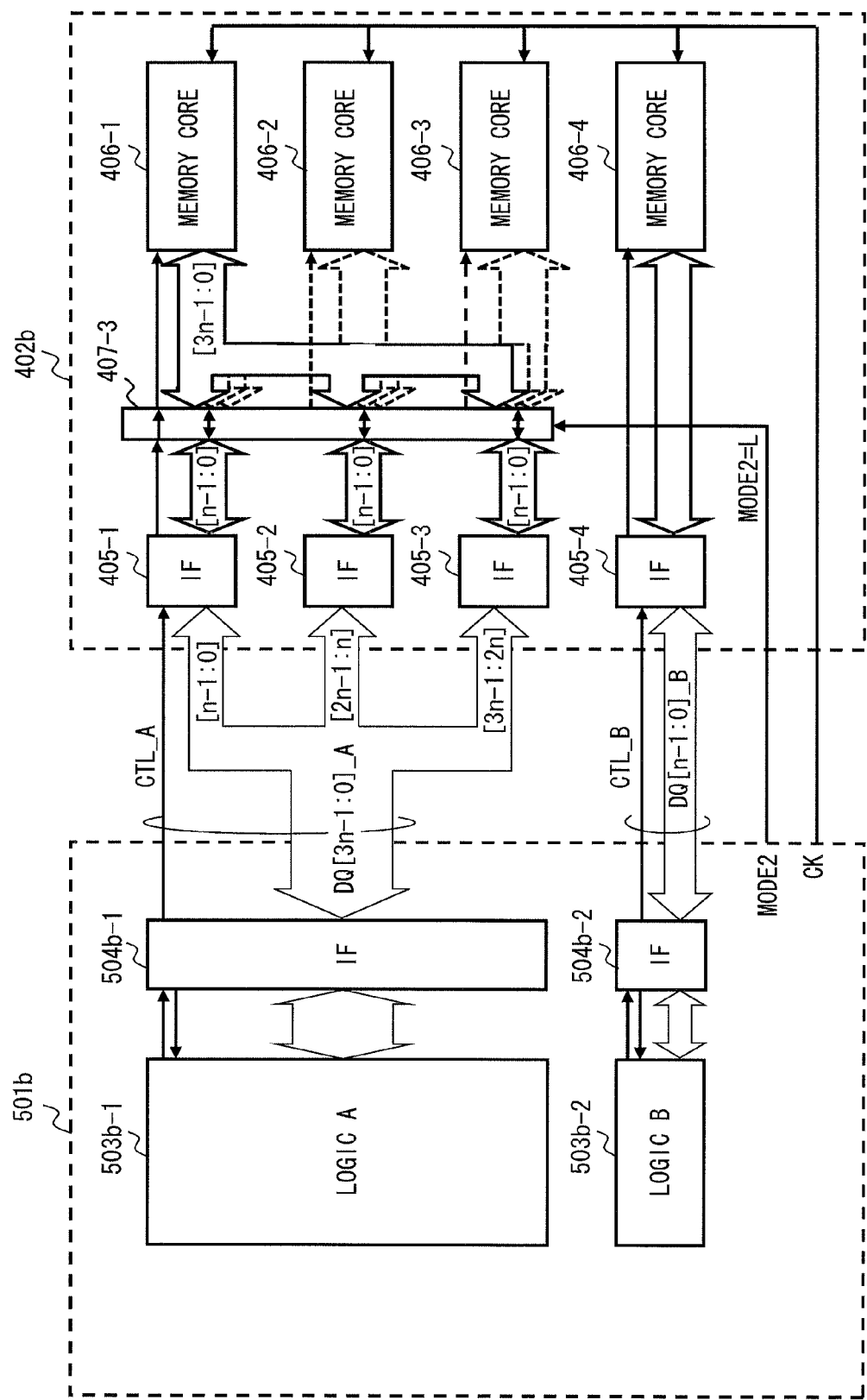
FIG. 5B is a block diagram showing a semiconductor integrated circuit according to a fifth embodiment of the present invention.

In the example shown in FIG. 5B, an L-level switching signal MODE2 is supplied from the FPGA 501b to the memory 402b. In this case, in the memory 402b, the select circuit 407-3 sets a first data signal path between the interface circuits 405-1 to 405-3 and the memory core 406-1 and also sets a first access control signal path between the interface circuit 405-1 and the memory core 406-1. Further, the select circuit 407-3 sets a second data signal path between the interface circuits 405-1 to 405-3 and the memory core 406-2 and also sets a second access control signal path between the interface circuit 405-1 and the memory core 406-2. Further, the select circuit 407-3 sets a third data signal path between the interface circuits 405-1 to 405-3 and the memory core 406-3 and also sets a third access control signal path between the interface circuit 405-1 and the memory core 406-3.

Not that the decision on which of the paths is used for memory access is made according to, for example, the value of the higher-order two bits of the address signal supplied to the interface circuit 405-1. An example in which the first data signal path and the first access control signal path are used for memory access is explained hereinafter. Therefore, in FIG. 5B, the first data signal path and the first access control signal path are drawn by solid lines and other signal paths are drawn by broken lines.

In this case, the functional block 503b-1 exchanges a data signal and an access control signal with the memory core 406-1.

Note that if an H-level switching signal MODE2 is supplied from the FPGA 501b, the select circuit 407-3 sets the paths of data signals and access control signals between the interface circuit 405-1 and the memory core 406-1, between the interface circuit 405-2 and the memory core 406-2, and between the interface circuit 405-3 and the memory core 406-3.

For example, when data is to be written into the memory, the functional block 503b-1 transmits data DQ[3n−1:0]_A having a 3n-bit width and a corresponding access control signal CTL_A to the memory 402b through the interface circuit 504b-1. In the memory 402b, data DQ[n−1:0]_A corresponding to an n-bit width is supplied to the interface circuit 405-1, and data DQ[2n−1:n]_A corresponding to another n-bit width is supplied to the interface circuit 405-2. Further, the remaining data DQ[3n−1:2n]_A corresponding to another n-bit width is supplied to the interface circuit 405-3. Then, the data DQ[n−1:0]_A, the data DQ[2n−1:n]_A, and the data DQ[3n−1:2n]_A supplied to the respective interface circuits 405-1 to 405-3 are input to the memory core 406-1 as the data DQ[3n−1:0]_A having a 3n-bit width. In this process, the access control signal CTL_A transmitted from the functional block 503b-1 is supplied only to the interface circuit 405-1. Then, the access control signal CTL_A is supplied to the memory core 406-1 through the interface circuit 405-1. As a result, the data DQ[3n−1:0]_A having a 3n-bit width is written into the memory core 406-1. In this process, the memory cores 406-2 and 406-3 are not operated.

Further, when data is to be read from the memory, the functional block 503b-1 transmits an access control signal CTL_A to the memory 402 through the interface circuit 504b-1. The access control signal CTL_A is supplied only to the interface circuit 405-1. Then, the access control signal CTL_A is supplied to the memory core 406-1 through the interface circuit 405-1. As a result, data DQ[3n−1:0]_A having a 3n-bit width is read from the memory core 406-1. Note that the read data DQ[3n−1:0]_A is divided into data DQ[n−1:0]_A having an n-bit width, data DQ[2n−1:n]_A having an n-bit width, and data DQ[3n−1:2n]_A having an n-bit width. Then, the divided data DQ[n−1:0]_A, data DQ[2n−1:n]_A, and data DQ[3n−1:2n]_A are transmitted to the functional block 503b-1 side through the interface circuits 405-1 to 405-3 respectively. In this process, the memory cores 406-2 and 406-3 are not operated.

In this manner, the data DQ_A having a 3n-bit width and the access control signal CTL_A are exchanged between the functional block 503-1 and the memory core 406-1 in the example shown in FIG. 5B. In this process, the access control signal CTL_A is supplied to only one of the interface circuits of the memory 402b.

The relation between the functional block 503b-2 and the memory core 406-4 is similar to the relation between the functional block 203b-2 and the memory core 106-4 shown in FIG. 2A, and therefore its explanation is omitted.

As described above, even in the configuration in which a data signal having a 3n-bit width is exchanged, the memory 402b and the semiconductor integrated circuit including thereof according to this embodiment can achieve similar advantageous effects to those of the fourth embodiment.

Sixth Embodiment

In this embodiment, a second modified example of the memory 402 shown in FIGS. 4 and 5A is explained with reference to FIG. 5C. A semiconductor integrated circuit shown in FIG. 5C includes an FPGA 501c and a memory 402c, which is a modified example of the memory 402. Note that a data signal having a 4n-bit width is exchanged between the FPGA 501c and the memory 402c.

Note that the FPGA 501c has a similar circuit configuration to that of the FPGA 201c shown in FIG. 2C. A functional block 503c-1 corresponds to the functional block 203c-1 shown in FIG. 2C. An interface circuit 504c-1 corresponds to the interface circuit 204c-1 shown in FIG. 2C. Therefore, the functional block 503c-1 transmits/receives data having a 4n-bit data width.

The memory 402c is different from the memory 402 in its configuration of the select circuit. Specifically, the memory 402c includes a select circuit 407-4 in place of the select circuits 407-1 and 407-2. Note that in this embodiment, an example in which each of the memory cores 406-1 to 406-4 can simultaneously read or write data having a data width of 4n bits at the maximum is explained.

The select circuit 407-4 is a circuit that sets the paths of data signals and access control signals between the interface circuits 405-1 to 405-4 and the memory cores 406-1 to 406-4 according to a switching signal MODE2 supplied from the external circuit (FPGA 501c).

Figure 5C:
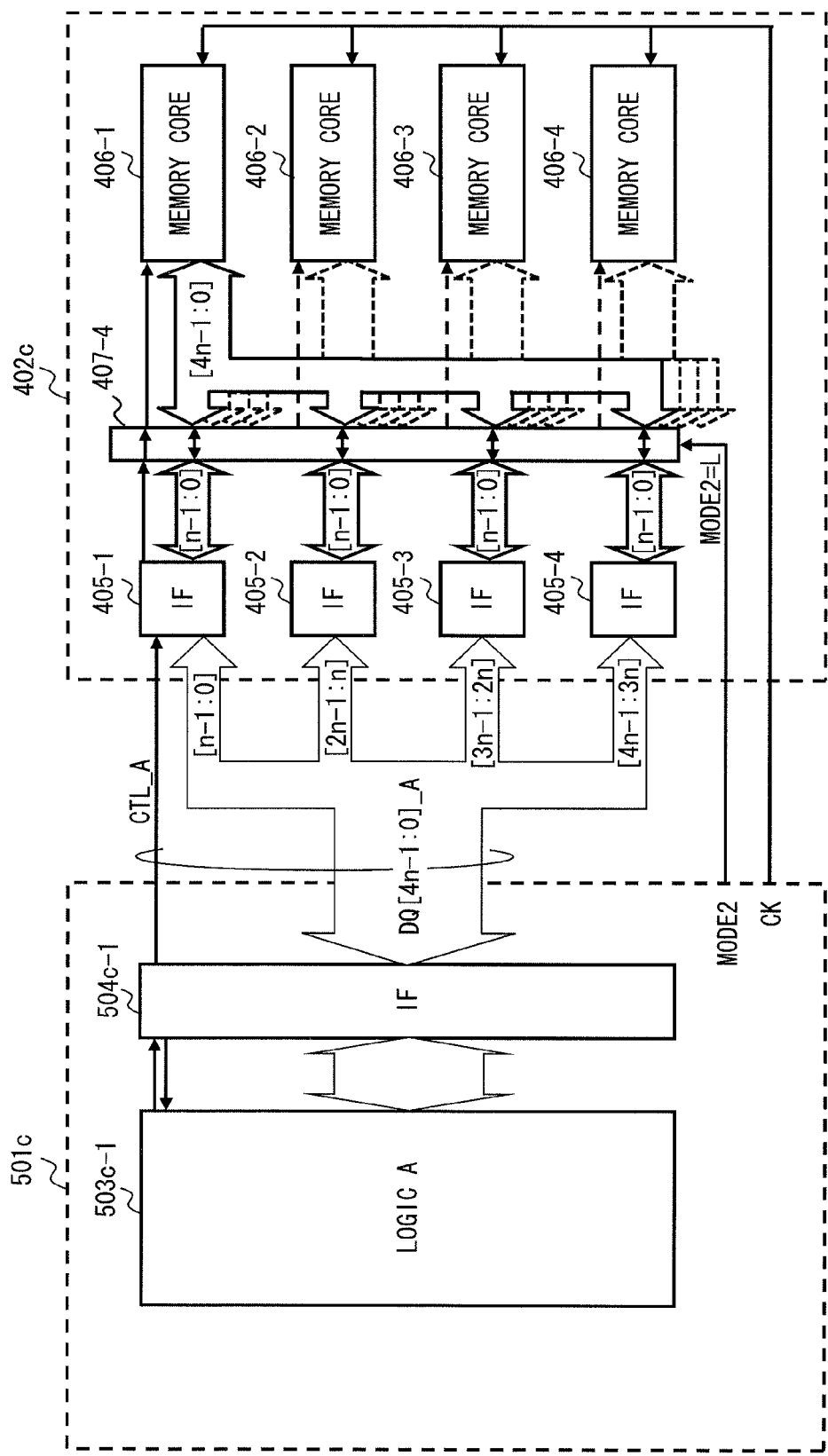
FIG. 5C is a block diagram showing a semiconductor integrated circuit according to a sixth embodiment of the present invention.

In the example shown in FIG. 5C, an L-level switching signal MODE2 is supplied from the FPGA 501c to the memory 402c. In this case, in the memory 402c, the select circuit 407-4 sets a first data signal path between the interface circuits 405-1 to 405-4 and the memory core 406-1 and also sets a first access control signal path between the interface circuit 405-1 and the memory core 406-1. Further, the select circuit 407-4 sets a second data signal path between the interface circuits 405-1 to 405-4 and the memory core 406-2 and also sets a second access control signal path between the interface circuit 405-1 and the memory core 406-2. Further, the select circuit 407-4 sets a third data signal path between the interface circuits 405-1 to 405-4 and the memory core 406-3 and also sets a third access control signal path between the interface circuit 405-1 and the memory core 406-3. Further, the select circuit 407-4 sets a fourth data signal path between the interface circuits 405-1 to 405-4 and the memory core 406-4 and also sets a fourth access control signal path between the interface circuit 405-1 and the memory core 406-4.

Not that the decision on which of the paths is used for memory access is made according to, for example, the value of the higher-order two bits of the address signal supplied to the interface circuit 405-1. An example in which the first data signal path and the first access control signal path are used for memory access is explained hereinafter. Therefore, in FIG. 5C, the first data signal path and the first access control signal path are drawn by solid lines and other signal paths are drawn by broken lines.

In this case, the functional block 503c-1 exchanges a data signal and an access control signal with the memory core 406-1.

Note that if an H-level switching signal MODE2 is supplied from the FPGA 501c, the select circuit 407-4 sets the paths of data signals and access control signals between the interface circuit 405-1 and the memory core 406-1, between the interface circuit 405-2 and the memory core 406-2, between the interface circuit 405-3 and the memory core 406-3, and between the interface circuit 405-4 and the memory core 406-4.

For example, when data is to be written into the memory, the functional block 503c-1 transmits data DQ[4n−1:0]_A having a 4n-bit width and a corresponding access control signal CTL_A to the memory 402c through the interface circuit 504c-1. In the memory 402c, data DQ[n−1:0]_A corresponding to an n-bit width is supplied to the interface circuit 405-1, and data DQ[2n−1:n]_A corresponding to another n-bit width is supplied to the interface circuit 405-2. Further, data DQ[3n−1:2n]_A corresponding to another n-bit width is supplied to the interface circuit 405-3 and the remaining data DQ[4n−1:3n]_A corresponding to another n-bit width is supplied to the interface circuit 405-4. Then, the data DQ[n−1:0]_A, the data DQ[2n−1:n]_A, the data DQ[3n−1:2n]_A, and the data DQ[4n−1:3n]_A supplied to the respective interface circuits 405-1 to 405-4 are input to the memory core 406-1 as the data DQ[4n−1:0]_A having a 4n-bit width. In this process, the access control signal CTL_A transmitted from the functional block 503c-1 is supplied only to the interface circuit 405-1. Then, the access control signal CTL_A is supplied to the memory core 406-1 through the interface circuit 405-1. As a result, the data DQ[4n−1:0]_A having a 4n-bit width is written into the memory core 406-1. In this process, the memory cores 406-2 to 406-4 are not operated.

Further, when data is to be read from the memory, the functional block 503c-1 transmits an access control signal CTL_A to the memory 402 through the interface circuit 504c-1. The access control signal CTL_A is supplied only to the interface circuit 405-1. Then, the access control signal CTL_A is supplied to the memory core 406-1 through the interface circuit 405-1. As a result, data DQ[4n−1:0]_A having a 4n-bit width is read from the memory core 406-1. Note that the read data DQ[4n−1:0]_A is divided into data DQ[n−1:0]_A having an n-bit width, data DQ[2n−1:n]_A having an n-bit width, data DQ[3n−1:2n]_A having an n-bit width, and data DQ[4n−1:3n]_A having an n-bit width. Then, the divided data DQ[n−1:0]_A, data DQ[2n−1:n]_A, data DQ[3n−1:2n]_A, and data DQ[4n−1:3n]_A are transmitted to the functional block 503c-1 side through the interface circuits 405-1 to 405-4 respectively. In this process, the memory cores 406-2 to 406-4 are not operated.

That is, the data DQ_A having a 4n-bit width and the access control signal CTL_A are exchanged between the functional block 503-1 and the memory core 406-1 in the example shown in FIG. 5C. In this process, the access control signal CTL_A is supplied to only one of the interface circuits of the memory 402c.

As described above, even in the configuration in which a data signal having a 4n-bit width is exchanged, the memory 402c and the semiconductor integrated circuit including thereof according to this embodiment can achieve similar advantageous effects to those of the fourth embodiment.

Seventh Embodiment

Figure 8A:
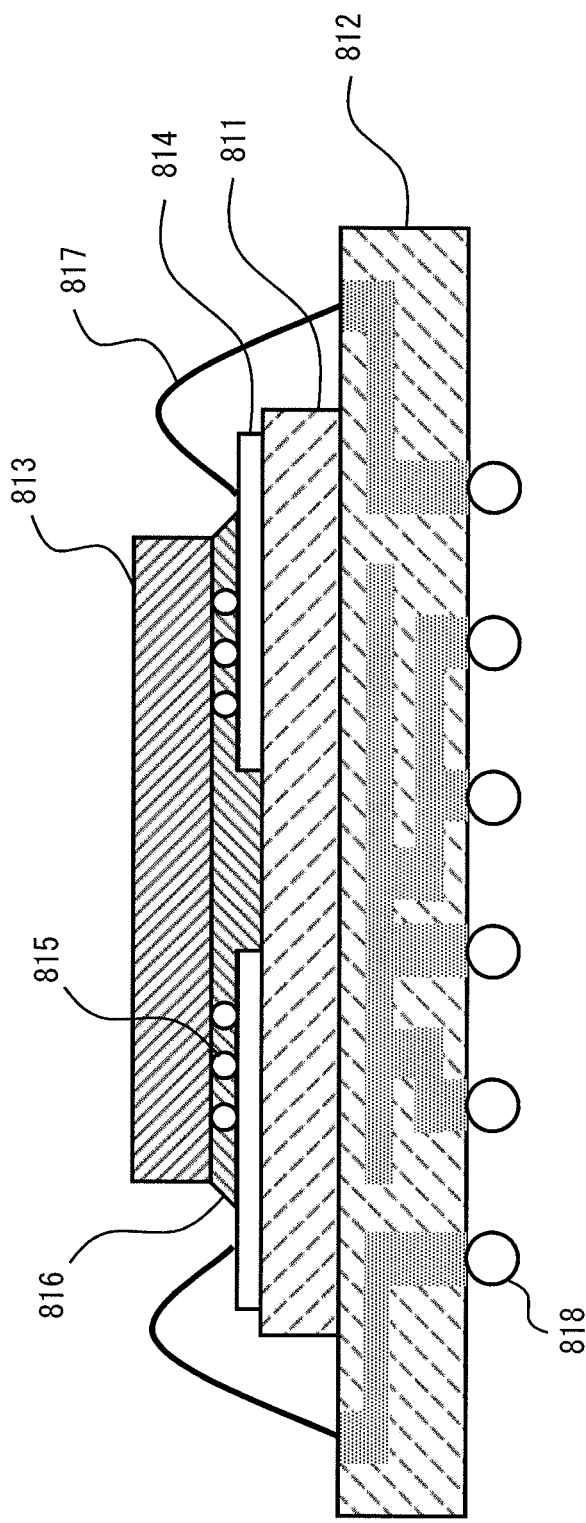
FIG. 8A is a cross section showing a semiconductor integrated circuit according to a seventh embodiment of the present invention.
Figure 8B:
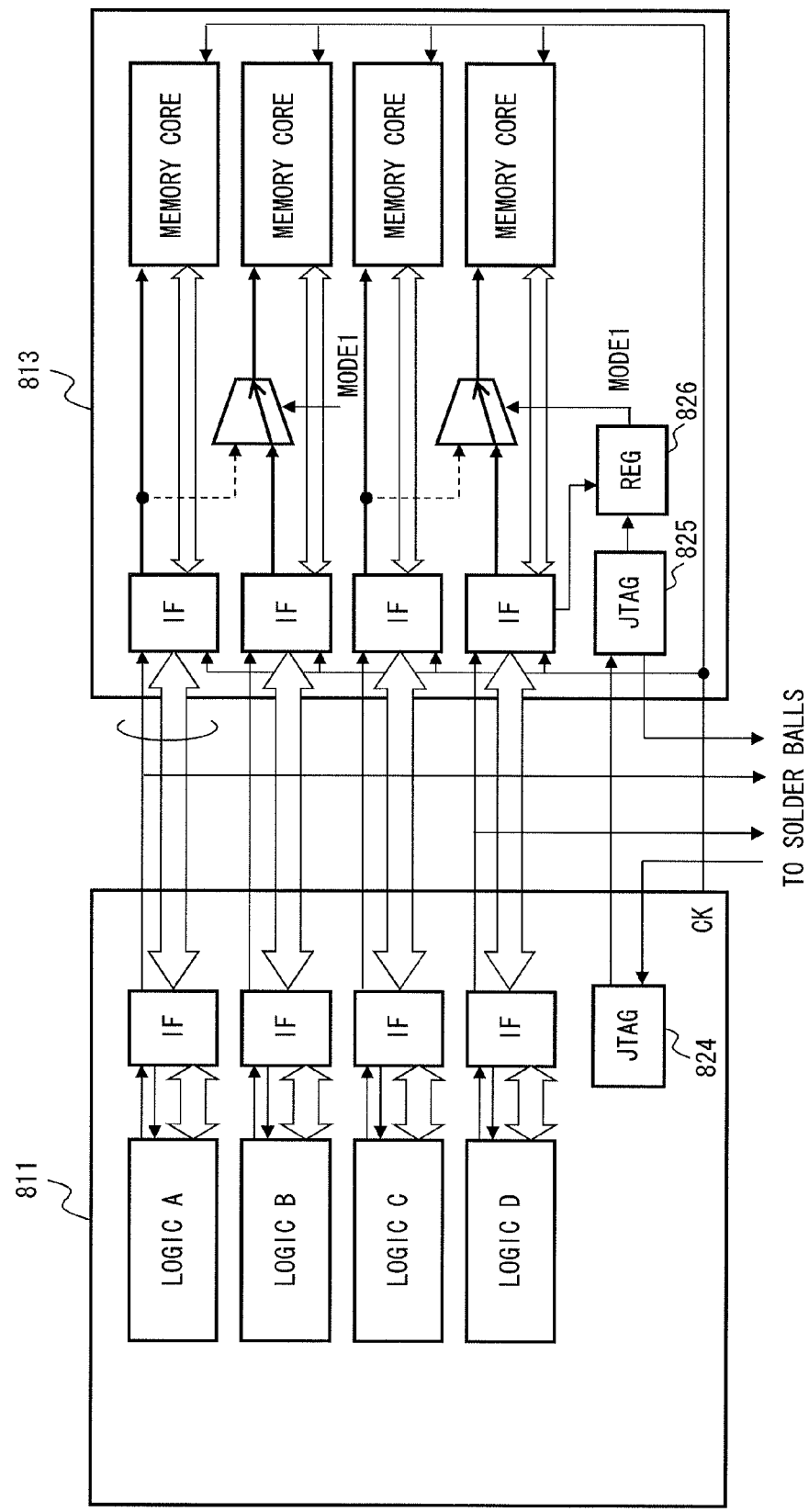
FIG. 8B is a block diagram showing a semiconductor integrated circuit according to a seventh embodiment of the present invention.

FIG. 8A is a cross section of a single package in which an FPGA 101 and a memory 102 that constitute a semiconductor integrated circuit shown in FIG. 1 are both encapsulated. Further, FIG. 8B is a block diagram showing the semiconductor integrated circuit shown in FIG. 8A. Note that an FPGA 811 and a memory 813 shown in FIGS. 8A and 8B correspond to the FPGA 101 and the memory 102, respectively, shown in FIG. 1.

As shown in FIG. 8A, the chip of the FPGA 811 is mounted on an interposer substrate 812 in such a manner that the FPGA 811 faces upward. The chip of the memory 813 is mounted above the FPGA 811 in such a manner that the memory 813 faces downward. Further, a rewiring layer 814 is formed between the FPGA 811 and the memory 813 in such a manner that the rewiring layer 814 is in contact with the FPGA 811. In this rewiring layer 814, signal lines connected between the FPGA 811 and the memory 813, various signal lines that are wired from the FPGA 811 chip or the memory 813 chip to the outside of the package, and power supply lines are formed. Note that bump electrodes 815 are disposed between the rewiring layer 814 and the memory 813 chip and electrically connect signal lines wired in the rewiring layer 814 with the memory 813.

Further, the space between the memory 813 chip and the rewiring layer 814 is filled with filling material 816 in order to prevent the misalignment of the bonding positions between the bump electrodes 815 and corresponding signal lines wired in the rewiring layer 814.

The external signal lines and the power supply lines, which are wired from the FPGA 811 or the memory 813 to the outside of the package, are connected to signal lines formed on the interposer substrate 812 through the rewiring layer 814 and bonding lines 817. These signal lines formed on the interposer substrate 812 are electrically connected to solder balls 818 disposed on the underside of the interposer substrate 812.

In FIG. 8B, the FPGA 811 and the memory 813 are electrically connected through various signal lines formed by the rewiring layer 814 and the bump electrodes 815 (both of which are not shown in the figure). Further, the external signal lines and the power supply lines, which are wired from the FPGA 811 or the memory 813 to the outside of the package, are electrically connected to external devices or the like through the rewiring layer 814, the bonding lines 817, the interposer substrate 812, and the solder balls 818 (all of which are not shown in the figure).

Further, in order to test the connection state of these various signal lines connected between the FPGA 811 and the memory 813, the FPGA 811 and the memory 813 include JTAG circuits 824 and 825, respectively, which conform to IEEE1149.1. Note the JTAG circuits 824 and 825 are connected in a cascade configuration in accordance with the specifications.

The memory 813 further includes a register 826 that generates a switching signal MODE1. The register 826 generates a switching signal MODE1 having a signal level that is determined according to control signals supplied from the JTAG circuits 824 and 825. That is, the register 826 generates a switching signal MODE1 having an arbitrary signal level under the control of the JTAG circuits 824 and 825. In this way, in the memory 813, signal paths between the interface circuits and the memory cores can be arbitrarily changed in the initial test that is carried out after the memory 813 is powered on. Note that it is also possible to output a switching signal MODE1 having a desired signal level from the register 826 even in the operation state other the initial test, i.e., even in the normal operation state. Therefore, in contrast to the memory 102, there is no need to provide a dedicated terminal(s) for externally receiving the switching signal MODE1.

Figure 9A:
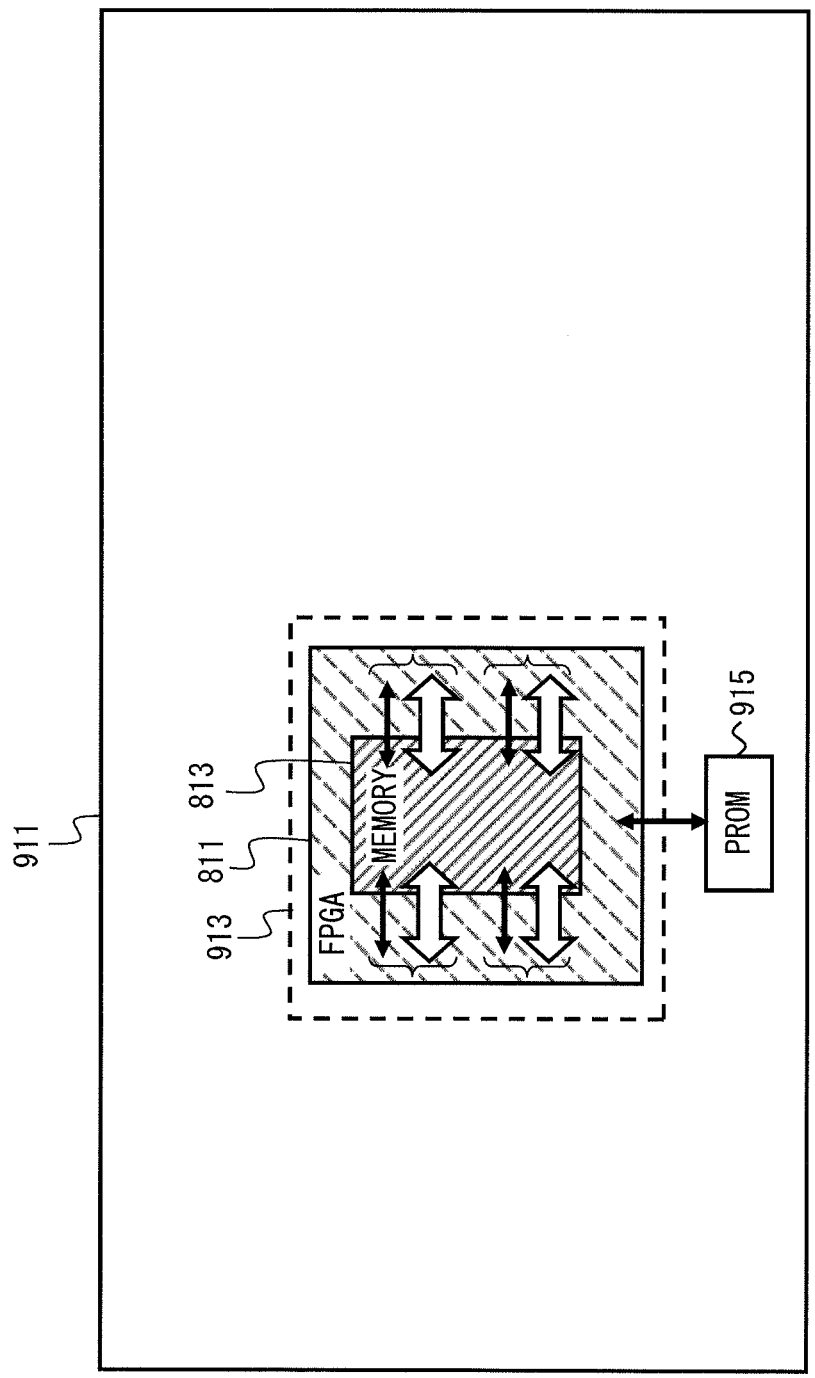
FIG. 9A is a figure showing a mounting example of a semiconductor integrated circuit according to a seventh embodiment of the present invention.
Figure 9B:
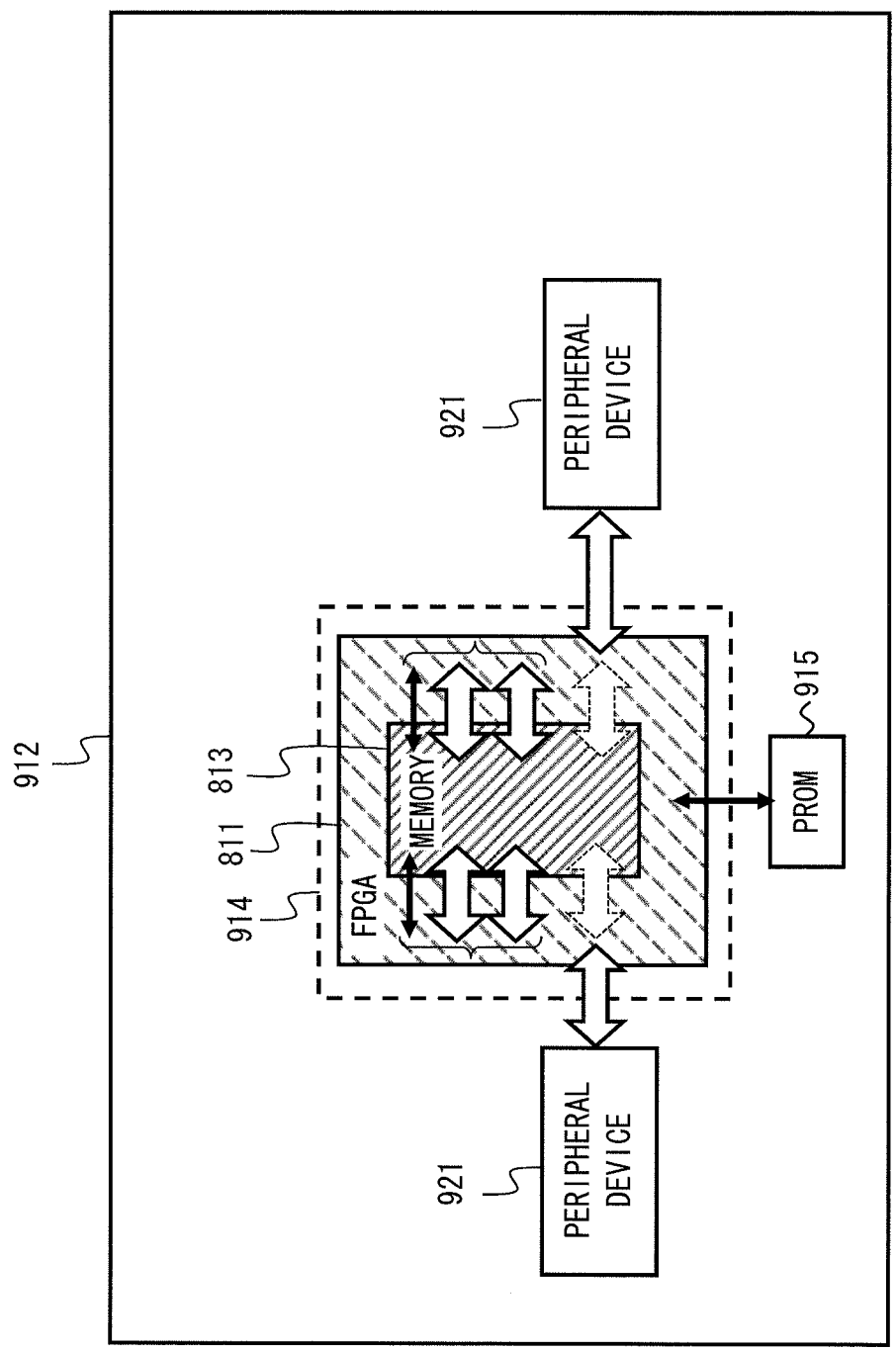
FIG. 9B is a figure showing another mounting example of a semiconductor integrated circuit according to a seventh embodiment of the present invention.

FIGS. 9A and 9B are conceptual diagrams of the semiconductor integrated circuit package shown in FIG. 8A when the semiconductor integrated circuit package is mounted on a system board. In FIG. 9A, a package 913 within which an FPGA 811 and a memory 813 are encapsulated and a nonvolatile memory 915 are mounted on a system board 911. Further, in FIG. 9B, a package 914 within which an FPGA 811 and a memory 813 are encapsulated and a nonvolatile memory 915 are mounted on a system board 912. Note that in the nonvolatile memory 915, a program that is used to determine the circuit configuration of the FPGA 811 and information that is used to set a switching signal MODE1 supplied to the select circuit located within the memory 813 are stored. During the system start-up, the program and the setting information of the switching signal MODE1 stored in the nonvolatile memory 915 are transmitted to the FPGA 811 and the memory 813 respectively through the JTAG circuits 824 and 825 (which are not shown in FIGS. 9A and 9B).

Note that FIG. 9A shows an example in which the program and the setting information of the switching signal MODE1 stored in the nonvolatile memory 915 are adjusted so that the FPGA 811 has a similar circuit configuration to that of the FPGA 101 shown in FIG. 1. That is, in the example shown in FIG. 9A, the FPGA 811 includes a comparatively large number of functional blocks that need to access the memory 813. Therefore, all of the plurality of interface circuits provided in the memory 813 are actually used (activated) for the interface with the FPGA 811.

Meanwhile, FIG. 9B shows an example in which the program and the setting information of the switching signal MODE1 stored in the nonvolatile memory 915 are adjusted so that the FPGA 811 has a similar circuit configuration to that of the FPGA 201 shown in FIG. 2A. That is, in the example shown in FIG. 9B, the FPGA 811 includes a comparatively small number of functional blocks that need to access the memory 813. Therefore, some of the plurality of interface circuits provided in the memory 813 are not used (not activated) for the interface with the FPGA 811. Note that the interface circuits on the FPGA 811 side that correspond to the non-activated interface circuits on the memory 813 side are connected, for example, to other peripheral devices 921 through the solder balls 818 (which are not shown in FIG. 9B) of the package that are electrically connected to the interface circuits, and thereby used for other purposes.

As described above, even in such situations that the FPGA chip and the memory chip are encapsulated in one package and therefore the replacement of either chip is very difficult, the FPGA can perform signal transmission with other peripheral devices. Therefore, the versatility of the FPGA is maintained.

Although an example in which the FPGA 101 and the memory 102, which constitute a semiconductor integrated circuit shown in FIG. 1, are encapsulated in a single package is explained in this embodiment, the present invention is not limited to this configuration. This is also true for semiconductor integrated circuits according to other embodiments.

Note that the present invention is not limited to the above-described first to seventh embodiments and various modifications can be made without departing from the spirit and scope of the present invention. Although examples in which the memory includes four interface circuits and four memory cores are explained in the above-described first to seventh embodiments, the present invention is not limited these configurations. That is, the above-described embodiments can be modified as appropriate so that they can be applied to other circuit configurations including an arbitrary number of interface circuits and an arbitrary number of memory cores.

Further, although the memories according to the above-described first to seventh embodiments has such a configuration that two types of data, i.e., data having an n-bit width and data having a 2n to 4n bit width can be selectively read or write, the present invention is not limited to this configuration. That is, the above-described embodiments can be modified as appropriate so that they can be applied to other configurations in which three or more types of data having different data widths can be selectively read or write. This is feasible, for example, by combining the functions of memories according to the first to third embodiments with one another, or combining the functions of memories according to the fourth to sixth embodiments with one another.

Figure 10:
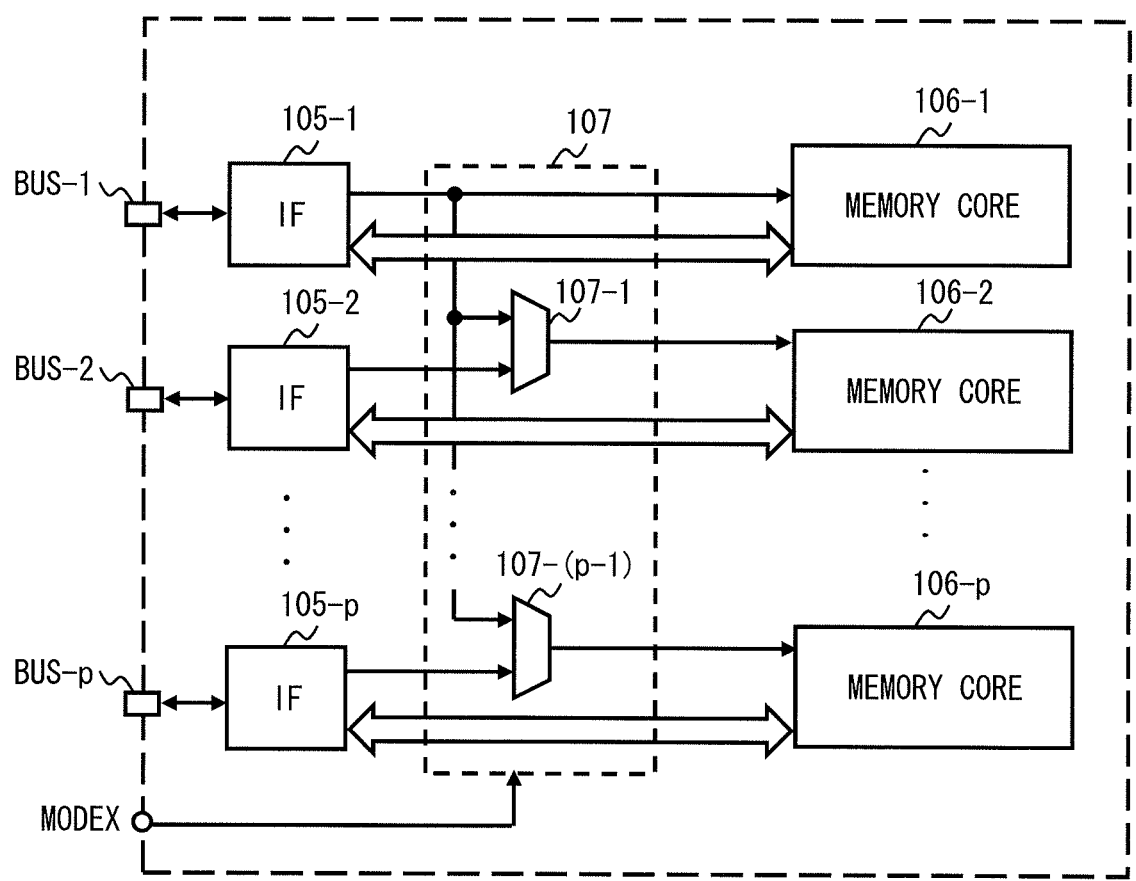
FIG. 10 is a diagram showing an application example of a memory according to first to third embodiments of the present invention.

As an application example of the memory according to first to third embodiments, FIG. 10 shows a memory capable of selectively reading or writing data having an arbitrary data width. The memory (semiconductor apparatus) shown in FIG. 10 includes interface circuits 105-1 to 105-p (p is a natural number), memory cores 106-1 to 106-p, and a select unit 107. Further, a data signal path is set between each of the interface circuits 105-1 to 105-p and a respective one of the memory cores 106-1 to 106-p. Note that the interface circuits 105-1 to 105-p are connected to external terminals BUS-1 to BUS-p respectively.

The select unit 107 includes select circuits 107-1 to 107-(p−1). The select circuits 107-1 to 107-(p−1) selectively output access control signals that are externally supplied to the interface circuits 105-2 to 105-p respectively or another access control signal that is externally supplied to the interface circuit 105-1, to the memory cores 106-2 to 106-p respectively. Note that each of the select circuits 107-1 to 107-(p−1) selects one of the access control signals according to an externally-supplied switching signal MODEX and outputs the selected access control signal. Note that the bit width of the switching signal MODEX is determined according to the number of the select circuits.

With the circuit configuration shown in FIG. 10, in the memory according to an aspect of the present invention, it is possible to selectively read/write data having an arbitrary data width ranging from twice to p times as large as the data width of each memory core from/to the memory.

Further, although the above-described first to seventh embodiments are explained by using examples in which the speed specification is SDR (Single Date Rate), the present invention is not limited to this configuration. The speed specification may be DDR (Double Data Rate) or QDR (Quad Data rate). Further, the present invention can be applied to memories adopting SIO (Separate I/O) in which input terminals and output terminals are independently provided. Further, the present invention can be also applied to memories having a Data Mask function.

Figure 11:
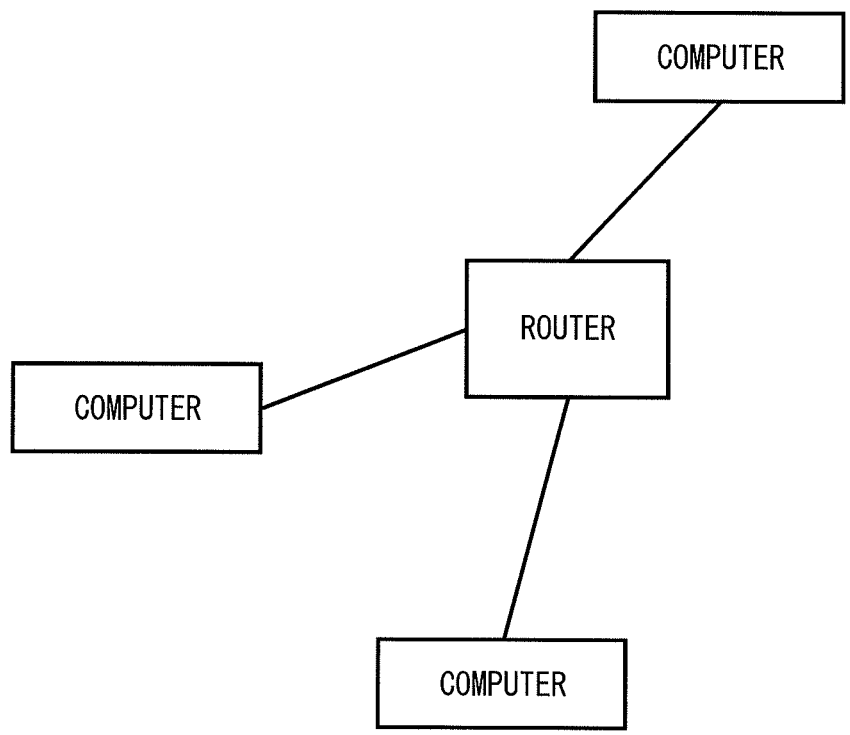
FIG. 11 is a diagram showing a network apparatus in which a memory according to an aspect of the present invention is mounted.

A memory according to an aspect of the present invention may be installed in a router that requires a high-speed data processing capability. It is expected that the power consumption of the router is reduced as the data processing performance of the router improves. Note that the term "router" means a network apparatus that connects different networks with each other as shown in FIG. 11.

Note that in the configuration disclosed in Japanese Unexamined Patent Application Publication No. 9-231131, when the data width of data to be processed becomes smaller, some of the memory cores cannot be accessed due to the reduced data width. In contrast to this, in a memory according to an aspect of the present invention, the memory core to be accessed can be selected according to the value of the highest-order bit of the address signal. Therefore, unlike the related art, the above-described situation in which some of the memory cores cannot be accessed never occurs in the memory according to an aspect of the present invention.

Further, in the multi-port memory disclosed in Japanese Unexamined Patent Application Publication No. 2009-230776, it is presumed that when access requests from two or more input/output ports to the same memory bank occur at the same time, the accesses are accepted one by one in the descending order of the priorities of the input/output ports. Therefore, an access from an input/output port having a low priority to the memory bank is delayed. As a result, there has been a problem in this multi-port memory that the data processing performance deteriorates. In contrast to this, a memory according to an aspect of the present invention has such a configuration that storage areas that cannot be simultaneously accessed are not simultaneously accessed. Therefore, unlike the related art, it is possible to prevent the deterioration of the data processing performance.

The first to seventh embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A semiconductor apparatus comprising:
   first and second bus-interface circuits;
   a first memory core connected to the first bus-interface circuit through a first data bus, the first memory core being connected to a first access control signal output from the first bus-interface circuit;
   a second memory core connected to the second bus-interface circuit through a second data bus; and
   a select circuit that selectively connects one of the first access control signal and a second access control signal output from the second bus-interface circuit to the second memory core.

2. The semiconductor apparatus according to claim 1, wherein the select circuit selects an access control signal to be connected to the second memory core according to an externally-supplied switching signal.

3. The semiconductor apparatus according to claim 1, further comprising:
   a third bus-interface circuit; and
   a third memory core connected to the third bus-interface circuit through a third data bus, wherein
   the select circuit selectively connects one of the first access control signal and a third access control signal output from the third bus-interface circuit to the third memory core.

4. The semiconductor apparatus according to claim 3, wherein the select circuit selects an access control signal to be connected to the third memory core according to an externally-supplied switching signal.

5. A network apparatus comprising a semiconductor apparatus according to claim 1.

6. A semiconductor apparatus comprising:
   a plurality of memory cores;
   a plurality of interface circuits including a first interface circuit, a data signal path being set between each of the plurality of interface circuits and a different one of storage areas of the plurality of memory cores; and
   a path switching circuit that sets, according to a switching signal, whether the first interface circuit supplies an access control signal to one memory core or to more than one memory core.

7. The semiconductor apparatus according to claim 6, wherein the switching signal is determined according to a data width of a data signal exchanged between the semiconductor apparatus and an external circuit that supplies the access control signal to the first interface circuit.

8. The semiconductor apparatus according to claim 6, wherein the path switching circuit sets a path of the data signal between the plurality of interface circuits and the plurality of memory cores so as to permit each of the plurality of interface circuits to interface an exchange of the data signal for a different one of the plurality of memory cores.

9. The semiconductor apparatus according to claim 6, wherein the path switching circuit sets a path of the data signal between the plurality of interface circuits and the memory cores so as to permit each of the plurality of interface circuits to interface an exchange of the data signal for a different one of storage areas of one of the plurality of memory cores.

10. The semiconductor apparatus according to claim 6, wherein the external circuit is formed on a field programmable gate array whose circuit configuration is rewritable.

11. The semiconductor apparatus according to claim 6, wherein an input terminal of an interface circuit that does not interface an exchange of the data signal among the plurality of interface circuits is fixed at a predetermined logic level.

12. A network apparatus comprising a semiconductor apparatus according to claim 6.

13. The semiconductor apparatus according to claim 1, wherein, in response to the select circuit selectively connecting the first access control signal to the second memory core, the first memory core and the second memory core each receive the first access control signal.

14. A semiconductor apparatus comprising:
   a first memory core configured to receive a first data signal and a first access control signal; and
   a second memory core configured to receive a second data signal and a selected access control signal, wherein
   in response to a selection signal supplied to the semiconductor apparatus having a first value, the selected access control signal is the first access control signal, and in response to the selection signal having a second value, the selected access control signal is a second control signal.

15. The semiconductor apparatus according to claim 14, further comprising:
   a path selection circuit configured to receive the first access control signal, the second access control signal, and the selection signal, and to output the selected access control signal.

16. The semiconductor apparatus according to claim 15, further comprising:
   a first interface circuit configured to output the first access control signal; and
   a second interface circuit configured to output the second access control signal.

17. The semiconductor apparatus according to claim 16, further comprising:
   a first path configured to transmit the first access control signal from the first interface circuit to the first memory core and to the path selection circuit;
   a second path configured to transmit the second access control signal from the second interface circuit to the path control circuit; and
   a third path configured to transmit the selected access control signal from the path control circuit to the second memory core.

* * * * *